(12) United States Patent
Ma et al.

(10) Patent No.: US 12,707,851 B2
(45) Date of Patent: Aug. 11, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Lulin Ma, Beijing (CN); Jaeho Lee, Beijing (CN); Dongyu Gao, Beijing (CN); Cheng Zeng, Beijing (CN); Li Chen, Beijing (CN); Zhen Sun, Beijing (CN); Jinglu Bai, Beijing (CN); Zhenye Wei, Beijing (CN); Qiyun Wang, Beijing (CN); Fei Chen, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 507 days.

(21) Appl. No.: 18/259,275

(22) PCT Filed: Sep. 28, 2022

(86) PCT No.: PCT/CN2022/122201

§ 371 (c)(1),
(2) Date: Jun. 25, 2023

(87) PCT Pub. No.: WO2024/065294

PCT Pub. Date: Apr. 4, 2024

(65) Prior Publication Data

US 2024/0389425 A1 Nov. 21, 2024

(51) Int. Cl.

*H10K 59/38* (2023.01)
*H10K 59/122* (2023.01)
*H10K 59/80* (2023.01)

(52) U.S. Cl.

CPC ........... *H10K 59/38* (2023.02); *H10K 59/122* (2023.02); *H10K 59/873* (2023.02); *H10K 59/877* (2023.02)

(58) Field of Classification Search

CPC .... H10K 59/122; H10K 59/38; H10K 59/873; H10K 59/8731

See application file for complete search history.

(56) References Cited

U.S. PATENT DOCUMENTS

2009/0278450 A1* 11/2009 Sonoyama ........... H10K 59/876 313/504
2013/0105781 A1 5/2013 Matsushima (Continued)

FOREIGN PATENT DOCUMENTS

CN 105372867 A 3/2016
CN 111180605 A 5/2020

(Continued)

OTHER PUBLICATIONS

International Search Report & Written Opinion mailed Jun. 8, 2023, regarding PCT/CN2022/122201.

*Primary Examiner* — Mariceli Santiago

(74) *Attorney, Agent, or Firm* — Intellectual Valley Law, P.C.

(57) ABSTRACT

A display panel includes a pixel definition layer on a base substrate, having a plurality of first apertures extending there-through; a light emitting layer at least partially in the plurality of first apertures; an encapsulating layer on a side of the pixel definition layer and the light emitting layer away from the base substrate; a bank layer on a side of the encapsulating layer away from the base substrate, having a plurality of second apertures extending there-through; and a color conversion layer at least partially in the plurality of second apertures. The color conversion layer comprises a plurality of color conversion blocks. A minimum height of (Continued)

a bottom of the bank layer with respect to a surface of the base substrate is greater than a minimum height of a bottom of a respective color conversion block with respect to the surface of the base substrate.

18 Claims, 17 Drawing Sheets

(56) References Cited

U.S. PATENT DOCUMENTS

| | | | | |
|---|---|---|---|---|
| 2018/0031910 | A1 | 2/2018 | Li et al. | |
| 2018/0033841 | A1 | 2/2018 | Yang et al. | |
| 2020/0152704 | A1 | 5/2020 | Jang et al. | |
| 2020/0264361 | A1 | 8/2020 | Yuan et al. | |
| 2021/0005672 | A1* | 1/2021 | Lee | H10K 59/8792 |
| 2021/0028327 | A1* | 1/2021 | Lin | H01L 25/0753 |
| 2021/0376020 | A1 | 12/2021 | Ahn et al. | |
| 2021/0384461 | A1 | 12/2021 | Kim et al. | |
| 2022/0052121 | A1* | 2/2022 | Jang | H10K 59/352 |
| 2022/0199948 | A1* | 6/2022 | Yeo | H10K 59/8731 |
| 2022/0278174 | A1 | 9/2022 | Yu et al. | |

FOREIGN PATENT DOCUMENTS

| | | | | | |
|---|---|---|---|---|---|
| CN | 111505866 | A | | 8/2020 | |
| CN | 111816683 | A | | 10/2020 | |
| CN | 113641041 | A | | 11/2021 | |
| CN | 113764477 | A | | 12/2021 | |
| CN | 114220835 | A | | 3/2022 | |
| KR | 20210057647 | A | * | 5/2021 | H01L 51/5262 |
| WO | WO-2022149663 | A1 | * | 7/2022 | H10K 50/865 |

* cited by examiner

| CD |
| --- |
| ETL |
| EML1 |
| HTL |
| AD |

FIG. 6A

| CD |
| --- |
| ETL |
| EML2 |
| CGL1 |
| EML1 |
| HTL |
| AD |

FIG. 6B

| CD |
| --- |
| ETL |
| EML3 |
| CGL2 |
| EML2 |
| CGL1 |
| EML1 |
| HTL |
| AD |

FIG. 6C

DISPLAY PANEL AND DISPLAY APPARATUS

CROSS-REFERENCE TO RELATED APPLICATION

This application is a national stage application under 35 U.S.C. § 371 of International Application No. PCT/CN2022/122201, filed Sep. 28, 2022, the contents of which are incorporated by reference in the entirety.

TECHNICAL FIELD

The present invention relates to display technology, more particularly, to a display panel and a display apparatus.

BACKGROUND

Quantum dots material has excellent optical and electrical properties, including a narrow emission peak (with a half-peak width of approximately 30 nm), a tunable spectrum (ranging from visible light to infrared light), high photochemical stability, and a low starting voltage. Wavelengths of light emitted from quantum dots materials are tunable at least in part based on the particle sizes of the quantum dots. Due to these excellent properties, quantum dots have become a focus of research and development in the fields of display technology.

SUMMARY

In one aspect, the present disclosure provides a display panel, comprising a base substrate; a pixel definition layer on the base substrate, having a plurality of first apertures extending through the pixel definition layer; a light emitting layer at least partially in the plurality of first apertures; an encapsulating layer on a side of the pixel definition layer and the light emitting layer away from the base substrate; a bank layer on a side of the encapsulating layer away from the base substrate, having a plurality of second apertures extending through the bank layer; and a color conversion layer at least partially in the plurality of second apertures; wherein the color conversion layer comprises a plurality of color conversion blocks; and a minimum height of a bottom of the bank layer with respect to a surface of the base substrate is greater than a minimum height of a bottom of a respective color conversion block of the plurality of color conversion blocks with respect to the surface of the base substrate.

Optionally, the encapsulating layer comprises a first inorganic encapsulating sub-layer, an organic encapsulating sub-layer on a side of the first inorganic encapsulating sub-layer away from the base substrate, and a second inorganic encapsulating sub-layer on a side of the organic encapsulating sub-layer away from the base substrate; the color conversion layer is on a side of the second inorganic encapsulating sub-layer away from the organic encapsulating sub-layer; and a maximum height of the pixel definition layer with respect to the surface of the base substrate is greater than a height of a first portion of the second inorganic encapsulating sub-layer at a center of an area of a respective first aperture of the plurality of first apertures with respect to the surface of the base substrate.

Optionally, the color conversion layer comprises a plurality of color conversion blocks; and the respective color conversion block is partially in a respective second aperture of the plurality of second apertures and partially in the respective first aperture.

Optionally, the maximum height of the pixel definition layer with respect to the surface of the base substrate is greater than a minimum height of a bottom of the respective color conversion block with respect to the surface of the base substrate.

Optionally, a ratio of a maximum thickness of the pixel definition layer to a maximum thickness of the bank layer is greater than 0.2.

Optionally, a maximum height of a second portion of the second inorganic encapsulating sub-layer with respect to the surface of the base substrate is greater than the height of the first portion of the second inorganic encapsulating sub-layer at the center of the area of the respective first aperture with respect to the surface of the base substrate by at least 1 μm; and an orthographic projection of the second portion of the second inorganic encapsulating sub-layer on the base substrate overlaps with an orthographic projection of the pixel definition layer on the base substrate.

Optionally, a thickness of a first portion of the organic encapsulating sub-layer at the center of the area of the respective first aperture is greater than a thickness of a second portion of the organic encapsulating sub-layer; and an orthographic projection of the second portion of the organic encapsulating sub-layer on the base substrate overlaps with an orthographic projection of the pixel definition layer on the base substrate.

Optionally, in a cross-section plane perpendicular to the surface of the base substrate and intersecting the bank layer, the pixel definition layer, and multiple adjacent color conversion blocks of the color conversion layer, a maximum width of the pixel definition layer is greater than a maximum width of the bank layer; and an orthographic projection of the pixel definition layer on the base substrate covers an orthographic projection of the bank layer on the base substrate.

Optionally, the color conversion layer comprises a plurality of color conversion blocks; a first portion of a respective color conversion block of the plurality of color conversion blocks is in direct contact with the bank layer; a second portion of the respective color conversion block is at the center of the area of the respective first aperture; a maximum height of the first portion of a respective color conversion block with respect to a surface of a second portion of the second inorganic encapsulating sub-layer is substantially the same as a maximum height of the second portion of the respective color conversion block with respect to a surface of the first portion of the second inorganic encapsulating sub-layer; and an orthographic projection of the second portion of the second inorganic encapsulating sub-layer on the base substrate overlaps with an orthographic projection of the pixel definition layer on the base substrate.

Optionally, a maximum height of the second portion of the respective color conversion block with respect to the surface of the second portion of the second inorganic encapsulating sub-layer is less than the maximum height of the second portion of the respective color conversion block with respect to the surface of the first portion of the second inorganic encapsulating sub-layer.

Optionally, the display panel further comprises a light scattering layer on a side of the second inorganic encapsulating sub-layer away from the organic encapsulating sub-layer; wherein the bank layer has a plurality of third apertures extending through the bank layer; the light scattering layer is at least partially in the plurality of third apertures; the light scattering layer comprises a plurality of light scattering blocks; and a respective light scattering block of the plurality of light scattering blocks is partially in a respective third aperture of the plurality of third apertures and partially in an individual first aperture of the plurality of first apertures.

Optionally, the maximum height of the pixel definition layer with respect to the surface of the base substrate is greater than a minimum height of a bottom of the respective light scattering block with respect to the surface of the base substrate; and a maximum height of a top of the respective light scattering block with respect to the surface of the base substrate is greater than the maximum height of the pixel definition layer with respect to the surface of the base substrate.

Optionally, a first portion of the respective light scattering block is in direct contact with the bank layer; a second portion of the respective light scattering block is at the center of the area of the individual first aperture; a maximum height of the first portion of a respective light scattering block with respect to a surface of a second portion of the second inorganic encapsulating sub-layer is substantially the same as a maximum height of the second portion of the respective light scattering block with respect to a surface of the first portion of the second inorganic encapsulating sub-layer; and an orthographic projection of the second portion of the second inorganic encapsulating sub-layer on the base substrate overlaps with an orthographic projection of the pixel definition layer on the base substrate.

Optionally, a maximum height of the second portion of the respective light scattering block with respect to the surface of the second portion of the second inorganic encapsulating sub-layer is less than the maximum height of the second portion of the respective light scattering block with respect to the surface of the first portion of the second inorganic encapsulating sub-layer.

Optionally, the display panel further comprises a color filter on a side of the color conversion layer away from the base substrate; wherein the color filter comprises a plurality of color filter blocks; a first color filter block of the plurality of color filter blocks is at least partially in a respective second aperture of the plurality of second apertures, and in direct contact with a color conversion block; and a second color filter block of the plurality of color filter blocks is at least partially in a respective third aperture of a plurality of third apertures, and in direct contact with a light scattering block.

Optionally, the display panel further comprises a support layer on a side of the encapsulating layer away from the base substrate; wherein the bank layer is on a side of the support layer away from the encapsulating layer; and the support layer comprises a light absorbing material or a light reflecting material.

Optionally, in a cross-section plane perpendicular to a surface of the base substrate and intersecting the bank layer, the support layer, the pixel definition layer, and multiple adjacent color conversion blocks of the color conversion layer, a maximum width of the support layer is greater than a maximum width of the bank layer; and an orthographic projection of the support layer on the base substrate covers an orthographic projection of the bank layer on the base substrate.

Optionally, a thickness of the support layer is greater than 1 μm.

Optionally, the color conversion layer comprises a plurality of color conversion blocks; a first portion of a respective color conversion block of the plurality of color conversion blocks is in direct contact with the support layer; a second portion of the respective color conversion block is at a center of the area of a respective second aperture of the plurality of second apertures; the encapsulating layer comprises a first inorganic encapsulating sub-layer, an organic encapsulating sub-layer on a side of the first inorganic encapsulating sub-layer away from the base substrate, and a second inorganic encapsulating sub-layer on a side of the organic encapsulating sub-layer away from the base substrate; and a maximum height of the first portion of a respective color conversion block with respect to a surface of the support layer is substantially the same as a maximum height of the second portion of the respective color conversion block with respect to a surface of a portion of the second inorganic encapsulating sub-layer at the center of the area of the respective second aperture.

Optionally, the display panel further comprises a plurality of third apertures extending through the bank layer and the support layer; and a light scattering layer; wherein the encapsulating layer comprises a first inorganic encapsulating sub-layer, an organic encapsulating sub-layer on a side of the first inorganic encapsulating sub-layer away from the base substrate, and a second inorganic encapsulating sub-layer on a side of the organic encapsulating sub-layer away from the base substrate; the light scattering layer is on a side of the second inorganic encapsulating sub-layer away from the organic encapsulating sub-layer; the light scattering layer is at least partially in the plurality of third apertures; the light scattering layer comprises a plurality of light scattering blocks; a first portion of a respective light scattering block of the plurality of light scattering blocks is in direct contact with the support layer; a second portion of the respective light scattering block is at a center of the area of a respective third aperture of the plurality of third apertures; and a maximum height of the first portion of a respective light scattering block with respect to a surface of the bank layer is substantially the same as a maximum height of the second portion of the respective light scattering block with respect to a surface of a portion of the second inorganic encapsulating sub-layer at the center of the area of the respective third aperture.

In another aspect, the present disclosure provides a display apparatus, comprising the display panel described herein; and one or more integrated circuit connected to the display panel.

BRIEF DESCRIPTION OF THE FIGURES

The following drawings are merely examples for illustrative purposes according to various disclosed embodiments and are not intended to limit the scope of the present invention.

FIG. 6A is a schematic diagram illustrating the structure of a light emitting element in some embodiments according to the present disclosure.

FIG. 6B is a schematic diagram illustrating the structure of a light emitting element in some embodiments according to the present disclosure.

FIG. 6C is a schematic diagram illustrating the structure of a light emitting element in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel and a display apparatus that substantially obviate one or more of the problems due to limitations and disadvantages of the related art. In one aspect, the present disclosure provides a display panel. In some embodiments, the display panel includes a base substrate; a pixel definition layer on the base substrate; a plurality of first apertures extending through the pixel definition layer; a light emitting layer at least partially in the plurality of first apertures; an encapsulating layer on a side of the pixel definition layer and the light emitting layer away from the base substrate; a bank layer on a side of the encapsulating layer away from the base substrate; a plurality of second apertures extending through the bank layer; and a color conversion layer at least partially in the plurality of second apertures. Optionally, the encapsulating layer includes a first inorganic encapsulating sub-layer, an organic encapsulating sub-layer on a side of the first inorganic encapsulating sub-layer away from the base substrate, and a second inorganic encapsulating sub-layer on a side of the organic encapsulating sub-layer away from the base substrate. Optionally, the color conversion layer is on a side of the second inorganic encapsulating sub-layer away from the organic encapsulating sub-layer. Optionally, a maximum height of the pixel definition layer with respect to a surface of the base substrate is greater than a height of a first portion of the second inorganic encapsulating sub-layer at a center of an area of a respective first aperture of the plurality of first apertures with respect to the surface of the base substrate.

Figure 1:
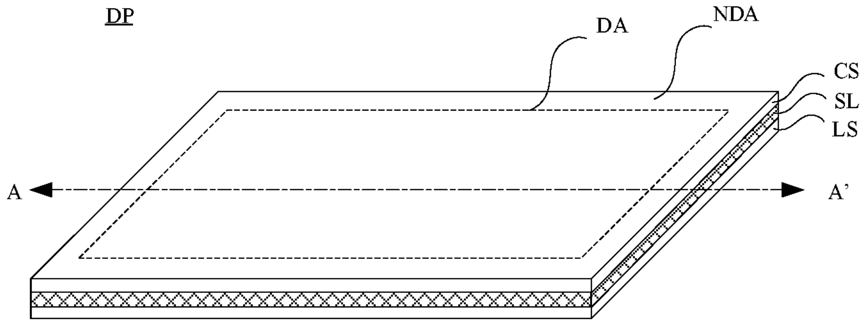
FIG. 1 is a schematic diagram illustrating the structure of a display panel in some embodiments according to the present disclosure.
Figure 2:
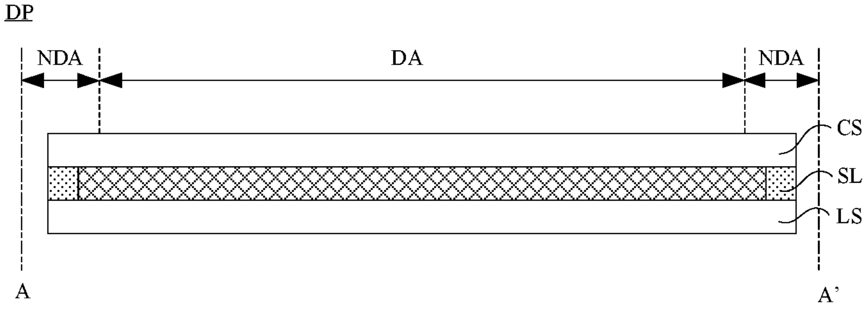
FIG. 2 is a cross-sectional view along an A-A' line in FIG. 1.

FIG. 1 is a schematic diagram illustrating the structure of a display panel in some embodiments according to the present disclosure. FIG. 2 is a cross-sectional view along an A-A' line in FIG. 1. Referring to FIG. 1 and FIG. 2, the display panel DP in some embodiments includes a light emitting substrate LS, a counter substrate CS, and a spacer layer SL spacing apart the light emitting substrate LS and the counter substrate CS. The display panel DP includes a display area DA and a non-display area NDA.

Figure 3:
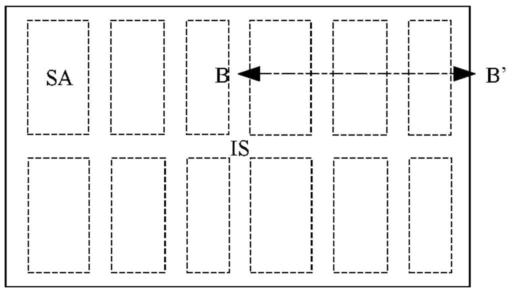
FIG. 3 is a plan view of a display panel in some embodiments according to the present disclosure.

FIG. 3 is a plan view of a display panel in some embodiments according to the present disclosure. Referring to FIG. 3, the display panel in some embodiments includes a plurality of subpixel region SR and an inter-subpixel region ISR. As used herein, a subpixel region refers to a light emission region of a subpixel, such as a region corresponding to a pixel electrode in a liquid crystal display, or a region corresponding to a light emissive layer in a light emitting diode display panel, or a region corresponding to a color conversion block in a display panel according to the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in a light emitting diode display panel, or a region corresponding to a bank layer in a display panel according to the present disclosure. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Various appropriate implementations may be practiced to make a display panel of the present disclosure. In one example, a light emitting substrate and a counter substrate are fabricated respectively, and then assembled together using a filler layer into a display panel. In another example, the counter substrate is directly fabricated on the light emitting substrate.

Figure 5:
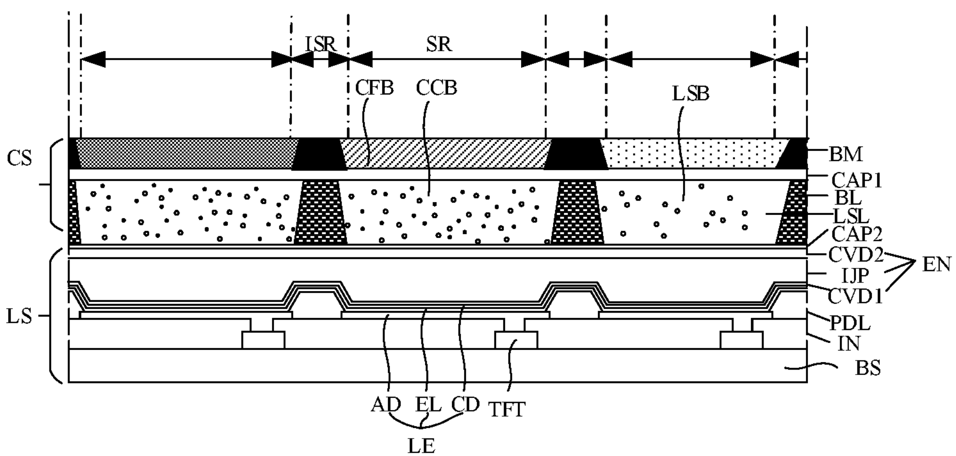
FIG. 5 is a cross-sectional view of a display panel in some embodiments according to the present disclosure.

FIG. 5 is a cross-sectional view of a display panel in some embodiments according to the present disclosure. Referring to FIG. 5, the display panel in some embodiments includes a light emitting substrate LS and a counter substrate CS. The light emitting substrate LS and the counter substrate CS are assembled together. In some embodiments, the display panel further includes a filler layer FL between the light emitting substrate LS and the counter substrate CS, assembling the light emitting substrate LS and the counter substrate CS into the display panel.

FIG. 5 is a cross-sectional view of a display panel in some embodiments according to the present disclosure. Referring to FIG. 5, the display panel is absent of a filler layer. The counter substrate CS is directly on the light emitting substrate LS, for example, directly on a surface of a second inorganic encapsulating sub-layer CVD2 of the light emitting substrate LS.

Figure 4:
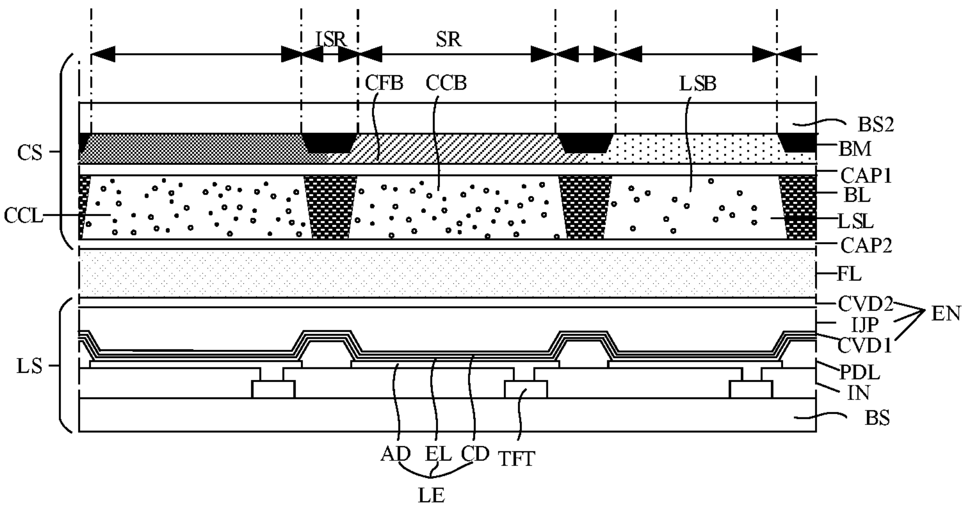
FIG. 4 is a cross-sectional view of a display panel in some embodiments according to the present disclosure.

Referring to FIG. 4 and FIG. 5, in some embodiments, the light emitting substrate LS includes a base substrate BS; a plurality of thin film transistor TFT (e.g., transistors in pixel driving circuits) on the base substrate BS; an insulating layer IN on a side of the plurality of transistor TFT away from the base substrate BS; a pixel definition layer PDL and a plurality of light emitting elements LE on a side of the insulating layer IN away from the base substrate BS; and an encapsulating layer EN on a side of the plurality of light emitting elements LE and the pixel definition layer PDL away from the base substrate BS. A respective light emitting element of the plurality of light emitting elements LE includes an anode AD, a light emitting layer EL on a side of the anode AD away from the base substrate BS, and a cathode CD on a side of the light emitting layer EL away from the base substrate BS. In one example, the encapsulating layer EN include a first inorganic encapsulating sub-layer CVD1, an organic encapsulating sub-layer IP on a side of the first inorganic encapsulating sub-layer CVD1 away from the base substrate BS, and a second inorganic encapsulating sub-layer CVD2 on a side of the organic encapsulating sub-layer IP away from the base substrate BS.

Referring to FIG. 4 and FIG. 5, in some embodiments, the counter substrate CS includes a bank layer BL defining a plurality of apertures, a color conversion layer CCL and a light scattering layer LSL at least partially in the plurality of apertures defined by the bank layer BL. The color conversion layer CCL includes a plurality of color conversion blocks CCB. The light scattering layer LSL includes a plurality of light scattering blocks LSB. The counter substrate CS in some embodiments further includes a color filter CF on the color conversion layer CCL and the light scattering layer LSL. The color filter CF includes a plurality of color filter blocks CFB. An orthographic projection of a respective color filter block of the plurality of color filter blocks CFB on a base substrate at least partially overlaps with an orthographic projection of a respective color conversion block or a respective light scattering block on the base substrate. Orthographic projections of adjacent color filter blocks may partially overlap with each other, e.g., along the edges. The counter substrate CS in some embodiments further includes a black matrix BM on a side of the color filter CF away from the color conversion layer CCL and the light scattering layer LSL. The black matrix BM is in the inter-subpixel region ISR. A respective color filter block, a respective color conversion block, or a respective light scattering block is at least partially in an individual subpixel region. Optionally, the counter substrate CS includes a second cap layer CAP2 on a side of the color filter CF closer to the bank layer BL, the color conversion layer CCL, and the light scattering layer LSL. The counter substrate CS optionally includes a second cap layer CAP2 on a side of the bank layer BL, the color conversion layer CCL, and the light scattering layer LSL away from the color filter CF.

In some embodiments, the display panel is a quantum dots display panel. In a quantum dots display panel, a light source (e.g., a blue light source) is used to excite quantum dots to emit light based on the photoluminescence excitation principle. In some embodiments, the plurality of color conversion blocks CCB include a first color conversion block and a second color conversion block. In one example, the first color conversion block is configured to convert a light of a third color (e.g., a blue light) into a light of a first color (e.g., a red light). In another example, the second color conversion block is configured to convert the light of the third color (e.g., a blue light) into a light of a second color (e.g., a green light). The plurality of light scattering blocks LSB do not convert a color of the incident light. Optionally, the plurality of light scattering blocks LSB are configured to scatter the incident light (e.g., a blue light), which emits through a color filter block for image display. The plurality of color filter blocks CFB includes a color filter block of a first color (e.g., a red color filter block) corresponding to the first color conversion block, a color filter block of a second color (e.g., a green color filter block) corresponding to the second color conversion block, and a color filter block of a third color (e.g., a blue color filter block) corresponding to a light scattering block.

Figures 6A, 6B, 6C:
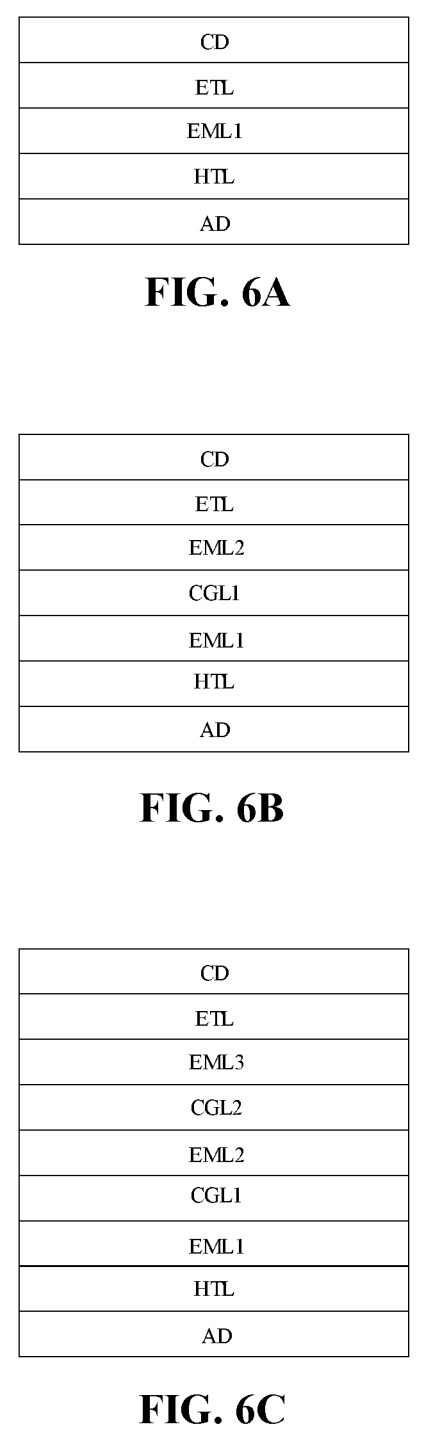

Various appropriate light emitting elements may be implemented in the display panel according to the present disclosure. FIG. 6A is a schematic diagram illustrating the structure of a light emitting element in some embodiments according to the present disclosure. Referring to FIG. 6A, the light emitting element in some embodiments includes an anode AD, a hole transport layer HTL on the anode AD, a first light emitting layer EML1 on a side of the hole transport layer HTL away from the anode AD, an electron transport layer ETL on a side of the first light emitting layer EML1 away from the hole transport layer HTL, and a cathode CD on a side of the electron transport layer ETL away from the first light emitting layer EML1.

In some embodiments, the light emitting element may have a stacked structure. FIG. 6B is a schematic diagram illustrating the structure of a light emitting element in some embodiments according to the present disclosure. Referring to FIG. 6B, the light emitting element in some embodiments includes an anode AD, a hole transport layer HTL on the anode AD, a first light emitting layer EML1 on a side of the hole transport layer HTL away from the anode AD, a first charge generation layer CGL1 on a side of the first light emitting layer EML1 away from the hole transport layer HTL, a second light emitting layer EML2 on a side of the first charge generation layer CGL1 away from the first light emitting layer EML1, an electron transport layer ETL on a side of the second light emitting layer EML2 away from the first charge generation layer CGL1, and a cathode CD on a side of the electron transport layer ETL away from the second light emitting layer EML2.

FIG. 6C is a schematic diagram illustrating the structure of a light emitting element in some embodiments according to the present disclosure. Referring to FIG. 6C, the light emitting element in some embodiments includes an anode AD, a hole transport layer HTL on the anode AD, a first light emitting layer EML1 on a side of the hole transport layer HTL away from the anode AD, a first charge generation layer CGL1 on a side of the first light emitting layer EML1 away from the hole transport layer HTL, a second light emitting layer EML2 on a side of the first charge generation layer CGL1 away from the first light emitting layer EML1, a second charge generation layer CGL2 on a side of the second light emitting layer EML2 away from the first charge generation layer CGL1, a third light emitting layer EML3 on a side of the second charge generation layer CGL2 away from the second light emitting layer EML2, an electron transport layer ETL on a side of the third light emitting layer EML3 away from the second charge generation layer CGL2, and a cathode CD on a side of the electron transport layer ETL away from the second light emitting layer EML3.

Figure 7A:
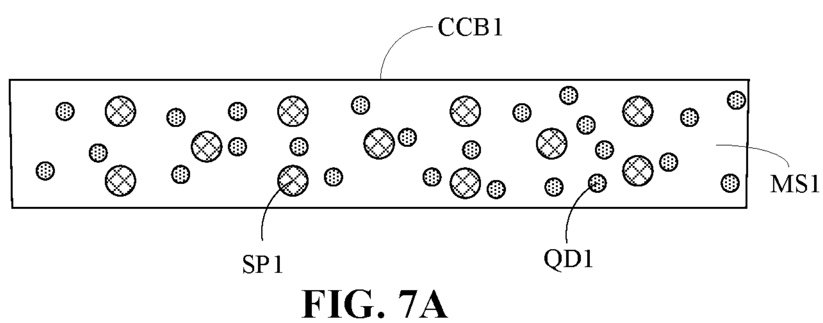
FIG. 7A is a schematic diagram illustrating the structure of a first color conversion block in some embodiments according to the present disclosure.

FIG. 7A is a schematic diagram illustrating the structure of a first color conversion block in some embodiments according to the present disclosure. Referring to FIG. 7A, the first color conversion block CCB1 is a color conversion block configured to convert a light of a third color (e.g., a blue light) into a light of a first color (e.g., a red light). In some embodiments, the first color conversion block CCB1 includes a first matrix MS1, a plurality of first scattering particles SP1 and a plurality of first quantum dots QD1 dispersed in the first matrix MS1. The first matrix MS1 may include a polymer material such as an organic polymer material. Examples of appropriate polymer materials for making the first matrix MS1 include epoxy resins, acrylic resins, polyurethane resins, silicone resins, and silane resins. Examples of appropriate materials for making the plurality of first scattering particles SP1 include $TiO_2$, ZnO, $ZrO_2$, $Al_2O_3$, $SiO_2$. Examples of appropriate quantum dots materials for making the plurality of first quantum dots QD1 include a quantum dots material of a first color (e.g., a red color). The quantum dots material may include a material selected from a group consisting of CdS, CdSe, ZnSe, InP, PbS, CsPbCl3, CsPbBr3, CsPhI3, CdS/ZnS, CdSe/ZnS, InP/ZnS, PbS/ZnS, CsPbCl3/ZnS, CsPbBr3/ZnS, and CsPhI3/ZnS.

Figure 7B:
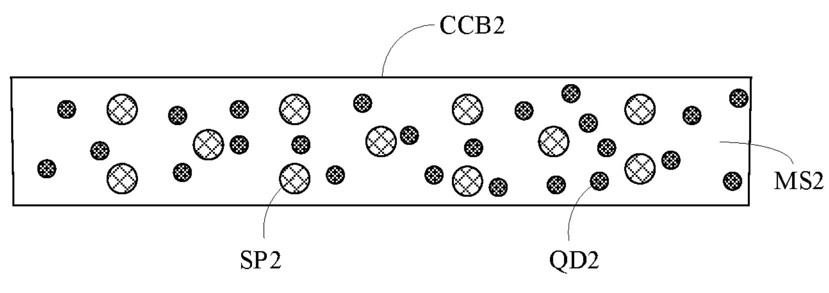
FIG. 7B is a schematic diagram illustrating the structure of a second color conversion block in some embodiments according to the present disclosure.

FIG. 7B is a schematic diagram illustrating the structure of a second color conversion block in some embodiments according to the present disclosure. Referring to FIG. 7B, the second color conversion block CCB2 is a color conversion block configured to convert a light of a third color (e.g., a blue light) into a light of a second color (e.g., a green light). In some embodiments, the second color conversion block CCB2 includes a second matrix MS2, a plurality of second scattering particles SP2 and a plurality of second quantum dots QD2 dispersed in the second matrix MS2. The second matrix MS2 may include a polymer material such as an organic polymer material. Examples of appropriate polymer materials for making the second matrix MS2 include epoxy resins, acrylic resins, polyurethane resins, silicone resins, and silane resins. Examples of appropriate materials for making the plurality of second scattering particles SP2 include $TiO_2$, ZnO, $ZrO_2$, $Al_2O_3$, $SiO_2$. Examples of appropriate quantum dots materials for making the plurality of second quantum dots QD2 include a quantum dots material of a second color (e.g., a green color). The quantum dots material may include a material selected from a group consisting of CdS, CdSe, ZnSe, InP, PbS, CsPbCl3, CsPbBr3, CsPhI3, CdS/ZnS, CdSe/ZnS, InP/ZnS, PbS/ZnS, CsPbCl3/ZnS, CsPbBr3/ZnS, and CsPhI3/ZnS.

Figure 7C:
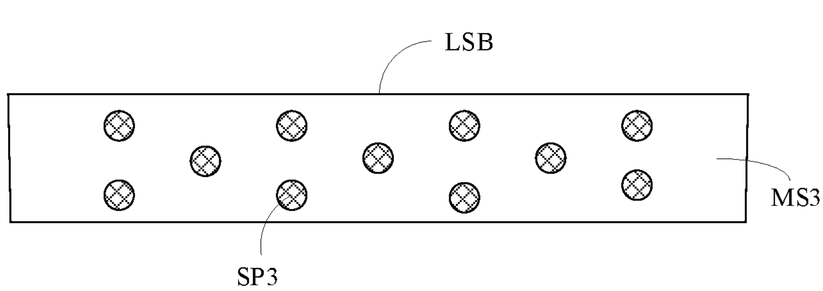
FIG. 7C is a schematic diagram illustrating the structure of a light scattering block in some embodiments according to the present disclosure.

FIG. 7C is a schematic diagram illustrating the structure of a light scattering block in some embodiments according to the present disclosure. Referring to FIG. 7C, the light scattering block LSB in some embodiments includes a third matrix MS3 and a plurality of third scattering particles SP3 dispersed in the third matrix MS3. The third matrix MS3 may include a polymer material such as an organic polymer material. Examples of appropriate polymer materials for making the third matrix MS3 include epoxy resins, acrylic resins, polyurethane resins, silicone resins, and silane resins. Examples of appropriate materials for making the plurality of third scattering particles SP3 include $TiO_2$, ZnO, $ZrO_2$, $Al_2O_3$, $SiO_2$.

In one example, the first matrix MS1, the second matrix MS2, and the third matrix MS3 includes a same polymer material. In another example, at least two of the first matrix MS1, the second matrix MS2, and the third matrix MS3 includes different polymer materials.

In one example, the first scattering particles SP1, the second scattering particles SP2, and the third scattering particles SP3 includes a same scattering material. In another example, at least two of the first scattering particles SP1, the second scattering particles SP2, and the third scattering particles SP3 includes different scattering materials.

Various appropriate methods may be used for making the color conversion layer and the light scattering layer. In one example, the color conversion layer and the light scattering layer may be fabricated by a printing process using inks comprising a color conversion material or a light scattering material. Typically, the ink-jet printer for printing the inks used an ink-jet head made of a hydrophobic material, and the inks include a highly hydrophilic solvent. The inks are disposed on the substrate, which typically contains a material having a free energy largely different from a free energy of the solvent of the inks. During the printing process, the ink typically climbs up the side walls of the bank layer, resulting in a color conversion layer or a light scattering layer that has a non-uniform thickness. Typically, the color conversion layer or the light scattering layer is thicker on edge and thinner in the center (e.g., "coffee-ring effect"). Particularly for the color conversion layer, the relatively smaller thickness in the center results in a lower light conversion efficiency, adversely affecting the color display of the display panel.

The inventors of the present disclosure discover that, surprisingly and unexpectedly, a novel structure of the display panel according to the present disclosure can effectively enhance light conversion efficiency in the color conversion layer, at the same time preventing or eliminating light leakage between adjacent subpixels.

Figure 8A:
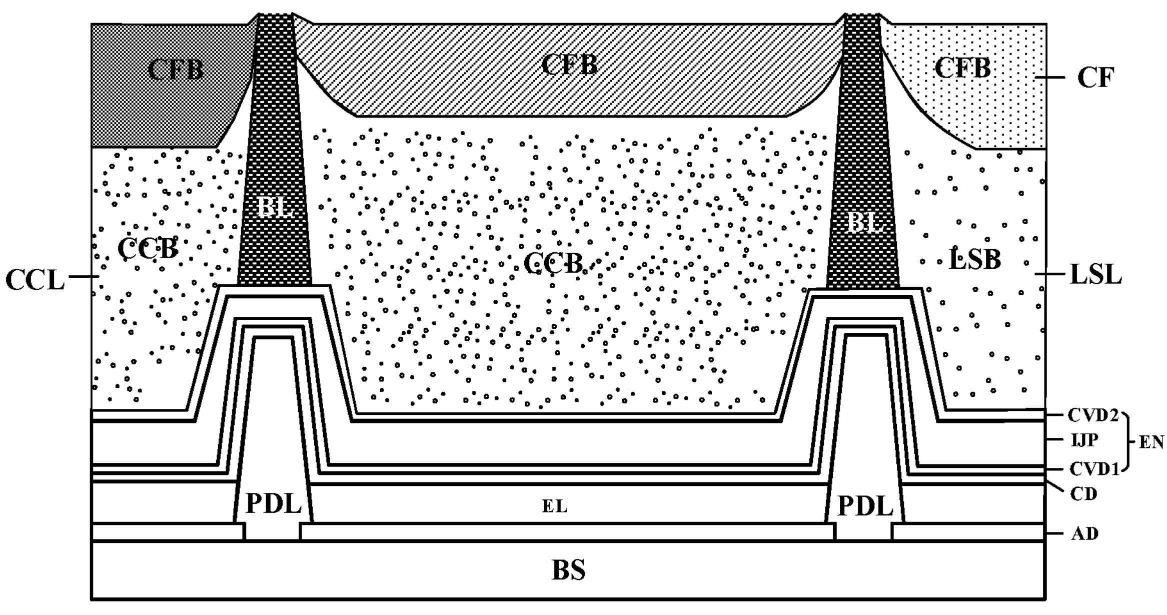
FIG. 8A is a cross-sectional view of a display panel in some embodiments according to the present disclosure.

FIG. 8A is a cross-sectional view of a display panel in some embodiments according to the present disclosure. FIG.

Figure 8B:
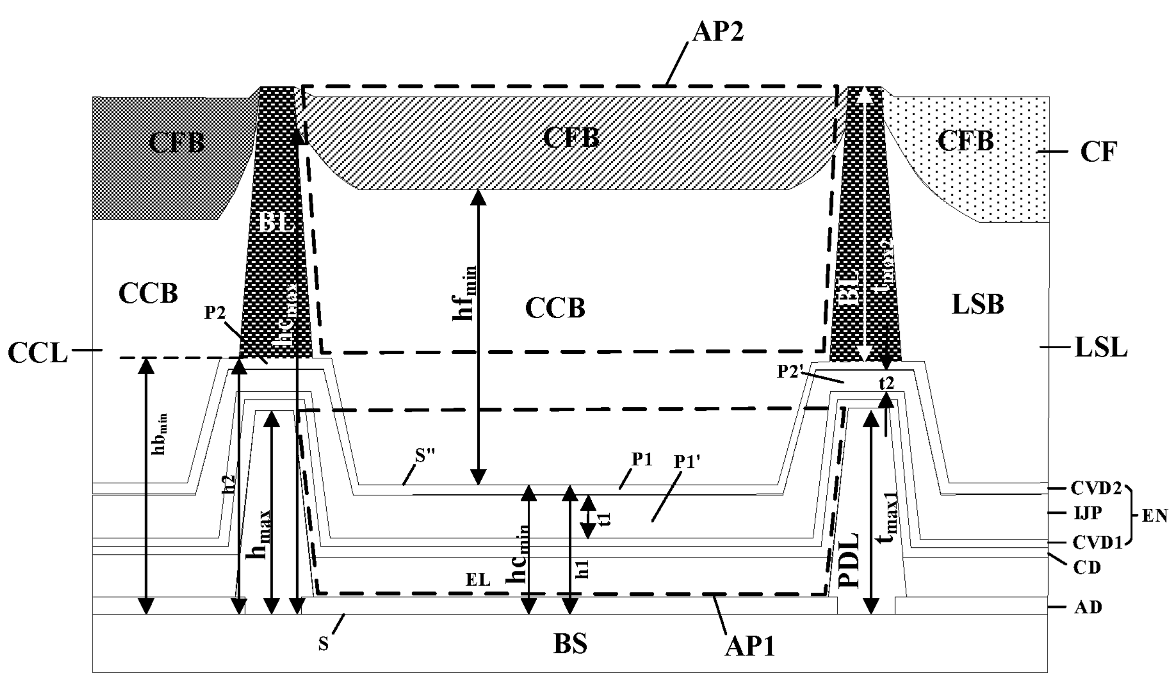
FIG. 8B is a schematic diagram illustrating structural features of the display panel depicted in FIG. 8A.

8B is a schematic diagram illustrating structural features of the display panel depicted in FIG. 8A. Referring to FIG. 8A and FIG. 8B, the display panel in some embodiments includes a base substrate BS; a pixel definition layer PDL on the base substrate BS; a plurality of first apertures AP1 extending through the pixel definition layer PDL; a light emitting layer EL at least partially in the plurality of first apertures AP1; an encapsulating layer EN on a side of the pixel definition layer PDL and the light emitting layer EL away from the base substrate BS; a bank layer BL on a side of the encapsulating layer EN away from the base substrate BS; a plurality of second apertures AP2 extending through the bank layer BL; and a color conversion layer CCL at least partially in the plurality of second apertures AP2.

As shown in FIG. 8A and FIG. 8B, the encapsulating layer EN in some embodiments includes a first inorganic encapsulating sub-layer CVD1, an organic encapsulating sub-layer IP on a side of the first inorganic encapsulating sub-layer CVD1 away from the base substrate BS, and a second inorganic encapsulating sub-layer CVD2 on a side of the organic encapsulating sub-layer IP away from the base substrate BS. The color conversion layer CCL is on a side of the second inorganic encapsulating sub-layer CVD2 away from the organic encapsulating sub-layer IJP.

Figure 8C:
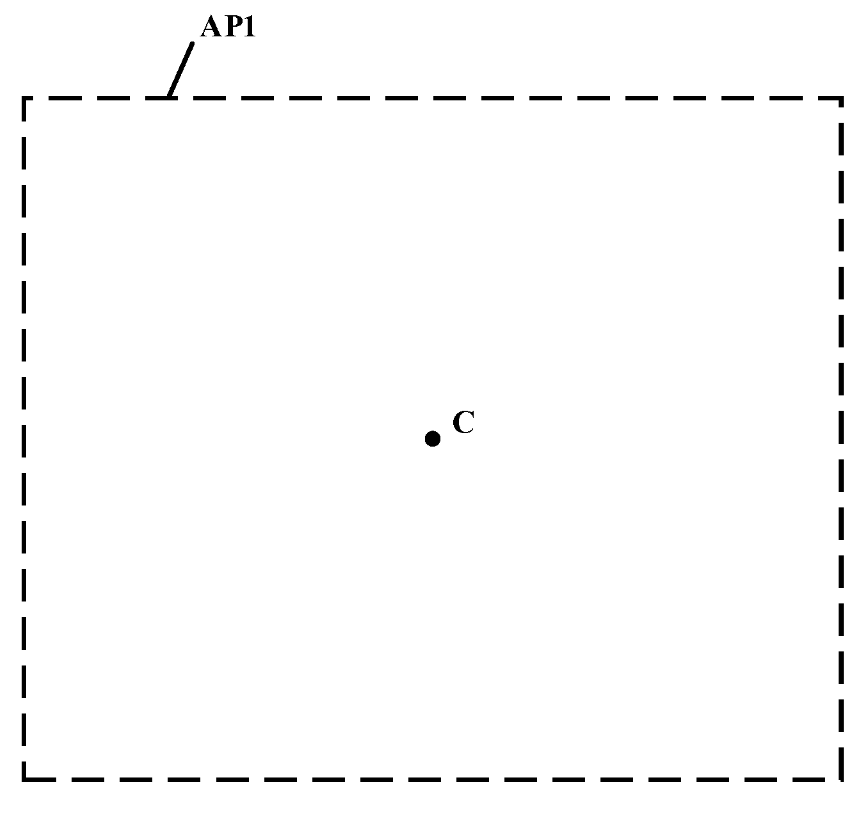
FIG. 8C shows a center of an area of a respective first aperture of the plurality of first apertures in some embodiments according to the present disclosure.

FIG. 8C shows a center of an area of a respective first aperture of the plurality of first apertures in some embodiments according to the present disclosure. In some embodiments, a maximum height $h_{max}$ of the pixel definition layer PDL with respect to a surface S of the base substrate BS is greater than a height h1 of a first portion P1 of the second inorganic encapsulating sub-layer CVD2 at a center C of an area of a respective first aperture of the plurality of first apertures AP1 with respect to the surface S of the base substrate BS.

In one example, the maximum height $h_{max}$ is greater than the height h1 by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

The inventors of the present disclosure discover that, by having the maximum height $h_{max}$ greater than the height h1, the color conversion color CCL has an increased overall thickness, effectively enhancing light conversion efficiency in the color conversion layer CCL. In some embodiments, a ratio of a maximum thickness $t_{max1}$ of the pixel definition layer PDL to a maximum thickness $t_{max2}$ of the bank layer BL is in a range of 0.07 to 0.56, e.g., 0.07 to 0.10, 0.10 to 0.15, 0.15 to 0.20, 0.20 to 0.25, 0.25 to 0.30, 0.30 to 0.35, 0.35 to 0.40, 0.40 to 0.45, 0.45 to 0.50, or 0.50 to 0.56. Optionally, the ratio of a maximum thickness $t_{max1}$ of the pixel definition layer PDL to a maximum thickness $t_{max2}$ of the bank layer BL is greater than 0.20, e.g., greater than 0.25, greater than 0.30, greater than 0.35, greater than 0.40, greater than 0.45, greater than 0.50, greater than 0.55, or greater than 0.60. The inventors of the present disclosure discover that, surprisingly and unexpectedly, a maximum light conversion efficiency in the color conversion layer CCL can be achieved by having the ratio of the maximum thickness $t_{max1}$ to the maximum thickness $t_{max2}$ in the above mentioned ratio range.

In one example, the maximum height $h_{max}$ and the maximum thickness $t_{max1}$ are the same. In another example, the maximum height $h_{max}$ and the maximum thickness $t_{max1}$ are different from each other.

In some embodiments, the cathode CD includes multiple (e.g., two) sub-layers. In the present display panel, the pixel definition layer PDL has an increased thickness and an increased height with respect to the surface S of the base substrate BS. To avoid cathode material agglomeration and breaks due to the presence of protrusion of the pixel definition layer PDL, the cathode CD may be fabricated by depositing one or more cathode material multiple times. In one example, a first sub-layer of the cathode CD has a thickness of approximately 5 nm, a second sub-layer of the cathode CD has a thickness of approximately 5 nm, and a total thickness of the cathode CD is in a range of 5 nm to 100 nm.

In some embodiments, the color conversion layer CCL includes a plurality of color conversion blocks CCB. Referring to FIG. 8A to FIG. 8C, in some embodiments, a respective color conversion block of the plurality of color conversion blocks CCB is partially in a respective second aperture of the plurality of second apertures AP2 and partially in the respective first aperture of the plurality of first apertures AP1.

In some embodiments, the maximum height $h_{max}$ of the pixel definition layer PDL with respect to the surface S of the base substrate BS is greater than a minimum height $hc_{min}$ of a bottom of the respective color conversion block with respect to the surface S of the base substrate BS. Optionally, a maximum height $hc_{max}$ of a top of the respective color conversion block with respect to the surface S of the base substrate BS is greater than the maximum height $h_{max}$ of the pixel definition layer PDL with respect to the surface S of the base substrate BS.

In some embodiments, a maximum height h2 of a second portion P2 of the second inorganic encapsulating sub-layer CVD2 with respect to the surface S of the base substrate BS is greater than the height h1 of the first portion P1 of the second inorganic encapsulating sub-layer CVD2 at the center C of the area of the respective first aperture with respect to the surface S of the base substrate BS by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm. Optionally, an orthographic projection of the second portion P2 of the second inorganic encapsulating sub-layer CVD2 on the base substrate BS overlaps with an orthographic projection of the pixel definition layer PDL on the base substrate BS.

In some embodiments, a thickness t1 of a first portion P1' of the organic encapsulating sub-layer IJP at the center C of the area of the respective first aperture is greater than a thickness t2 of a second portion P2' of the organic encapsulating sub-layer IJP. Optionally, an orthographic projection of the second portion P2' of the organic encapsulating sub-layer IJP on the base substrate BS overlaps with an orthographic projection of the pixel definition layer PDL on the base substrate BS.

The inventors of the present disclosure discover that, by having the thickness t1 greater than the thickness t2, a topology of the substrate due to the presence of the protrusion of the pixel definition layer PDL may be maintained after the encapsulating layer EN is formed on the substrate. In one example, the organic encapsulating sub-layer IP is made to have a relatively small overall thickness. In another example, the thickness t1 is greater than the thickness t2 by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm. In another example, the thickness t1 is in a range of 3.0 μm to 9.0 μm, e.g., 3.0 μm to 4.0 μm, 4.0 μm to 5.0 μm, 5.0 μm to 6.0 μm, 6.0 μm to 7.0 μm, 7.0 μm to 8.0 μm, or 8.0 μm to 9.0 μm. In another example, the thickness t2 is in a range of 1.0 μm to 5.0 μm, e.g., 1.0 μm to 2.0 μm, 2.0 μm to 3.0 μm, 3.0 μm to 4.0 μm, or 4.0 μm to 5.0 μm. Although the organic encapsulating sub-layer IJP has a relatively small overall thickness as compared to that in a related display panel, the color conversion layer CCL and the light scattering layer LSL in the present display panel are also capable of prevent moisture and oxygen from entering the light emitting elements, compensating the relatively small overall thickness of the organic encapsulating sub-layer IP.

In some embodiments, a minimum height $hb_{min}$ of a bottom of the bank layer BL with respect to the surface S of the base substrate BS is greater than a minimum height $hc_{min}$ of a bottom of the respective color conversion block with respect to the surface S of the base substrate BS by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

In some embodiments, the maximum height $h_{max}$ of the pixel definition layer PDL with respect to the surface S of the base substrate BS is greater than a minimum height $hf_{min}$ of a bottom of the respective color filter block CFB with respect to with respect to a surface S" of the first portion P1 of the second inorganic encapsulating sub-layer CVD2.

In some embodiments, the first inorganic encapsulating sub-layer CVD1 is formed by an atomic layer deposition process. The first inorganic encapsulating sub-layer CVD1 formed by the atomic layer deposition process is more compact and less prone to break, thus requires a small thickness to effectively prevent moisture and oxygen from entering the light emitting elements. By forming the first inorganic encapsulating sub-layer CVD1 using the atomic layer deposition process, the overall thickness of the encapsulating layer EN can be further reduced, preserving the topology of the substrate due to the presence of the protrusion of the pixel definition layer PDL.

Figure 9:
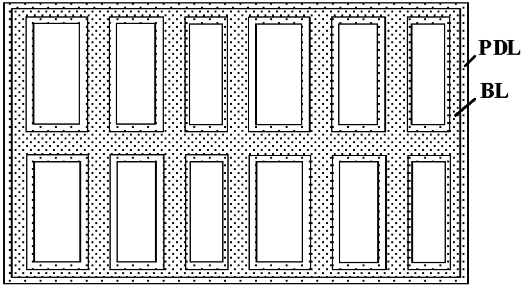
FIG. 9 a plan view illustrating the structure of a pixel definition layer and a bank layer in some embodiments according to the present disclosure.

FIG. 9 a plan view illustrating the structure of a pixel definition layer and a bank layer in some embodiments according to the present disclosure. Referring to FIG. 9, in some embodiments, an orthographic projection of the pixel definition layer PDL on the base substrate covers an orthographic projection of the bank layer BL on the base substrate.

Figure 10:
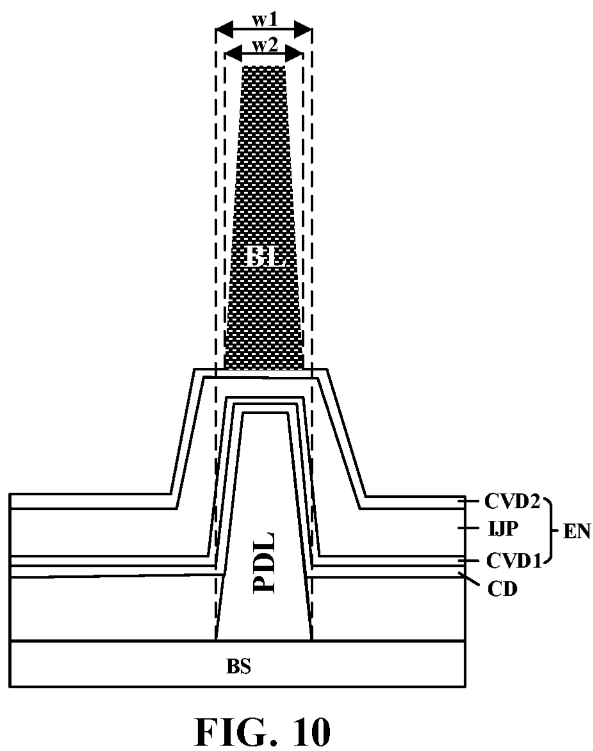
FIG. 10 is a cross-sectional view illustrating structure features of a pixel definition layer and a bank layer in some embodiments according to the present disclosure.

FIG. 10 is a cross-sectional view illustrating structure features of a pixel definition layer and a bank layer in some embodiments according to the present disclosure. Referring to FIG. 10, FIG. 8A, and FIG. 8B, in a cross-section plane perpendicular to the surface S of the base substrate BS and intersecting the bank layer BL, the pixel definition layer PDL, and multiple adjacent color conversion blocks of the color conversion layer CCL, a maximum width w1 of the pixel definition layer PDL is greater than a maximum width w2 of the bank layer BL. The inventors of the present disclosure discover that, by having the maximum width w1 of the pixel definition layer PDL greater than a maximum width w2 of the bank layer BL, the issue of the bank layer BL collapsing at the edge of the underlying protrusion of the raised pixel definition layer can be effectively prevented.

Figure 8D:
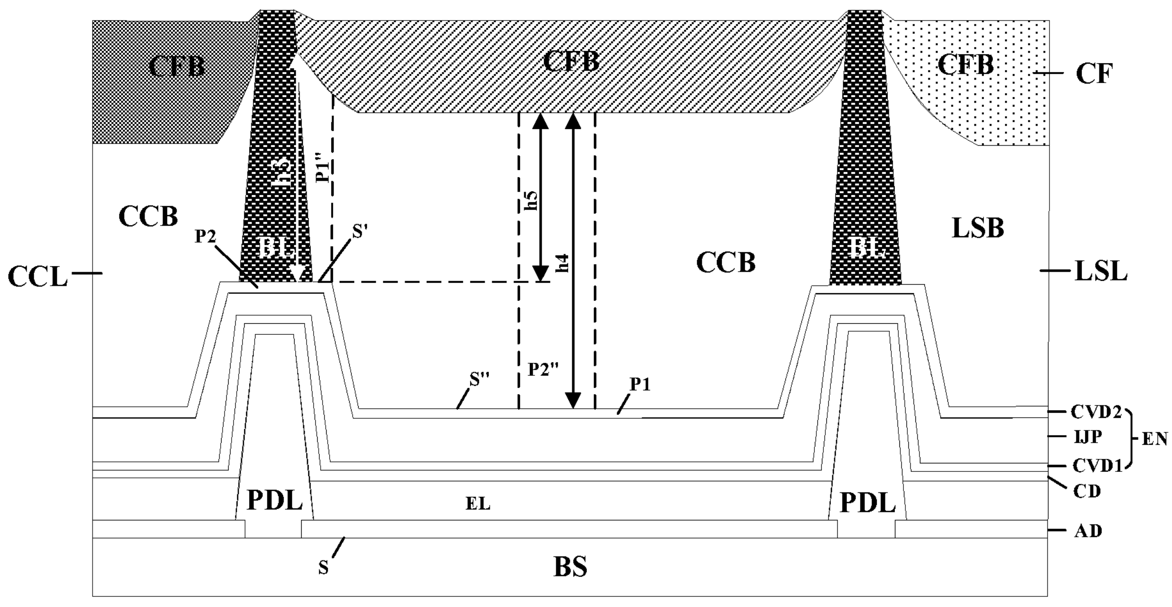
FIG. 8D is a schematic diagram illustrating structural features of the display panel depicted in FIG. 8A.

FIG. 8D is a schematic diagram illustrating structural features of the display panel depicted in FIG. 8A. Referring to FIG. 8A to FIG. 8D, in some embodiments, the color conversion layer CCL includes a plurality of color conversion blocks CCB. A respective color conversion block of the plurality of color conversion blocks CCB includes a first portion P1" in direct contact with the bank layer BL, and a second portion P2" at the center C of the area of the respective first aperture. In some embodiments, a maximum height h3 of the first portion P1" of a respective color conversion block with respect to a surface S' of a second portion P2 of the second inorganic encapsulating sub-layer CVD2 is substantially the same as a maximum height h4 of the second portion P2" of the respective color conversion block with respect to a surface S" of the first portion P1 of the second inorganic encapsulating sub-layer CVD2. Optionally, an orthographic projection of the second portion P2 of the second inorganic encapsulating sub-layer CVD2 on the base substrate BS overlaps with an orthographic projection of the pixel definition layer PDL on the base substrate BS.

As used herein, the term "substantially the same" refers to a difference between two values not exceeding 25% of a base value (e.g., one of the two values), e.g., not exceeding 24%, not exceeding 22%, not exceeding 20%, not exceeding 18%, not exceeding 16%, not exceeding 14%, not exceeding 12%, not exceeding 10%, not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

The inventors of the present disclosure discover that the unique structure of the present display panel, particularly the unique feature of the raised pixel definition layer, results in a substantially uniform thickness of the color conversion block at the center of the first aperture or the second aperture versus at the edge of the second aperture, despite the coffee-ring effect. The color conversion layer has an increased overall thickness, a substantially uniform thickness, an increased light conversion efficiency, leading to a decreased light leakage between adjacent subpixels.

In some embodiments, a maximum height h5 of the second portion P2" of the respective color conversion block with respect to the surface S' of the second portion P2 of the second inorganic encapsulating sub-layer CVD2 is less than the maximum height h4 of the second portion P2" of the respective color conversion block with respect to the surface S" of the first portion P1 of the second inorganic encapsulating sub-layer CVD2. Optionally, the maximum height h5 is less than the maximum height h4 by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

Figure 11A:
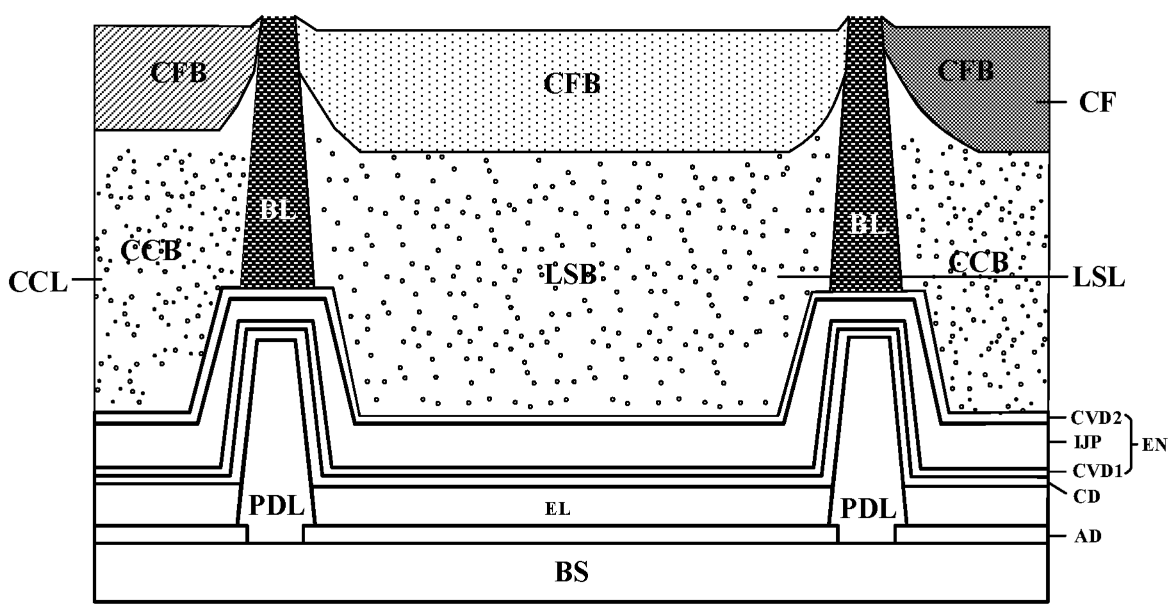
FIG. 11A is a cross-sectional view of a display panel in some embodiments according to the present disclosure.
Figure 11B:
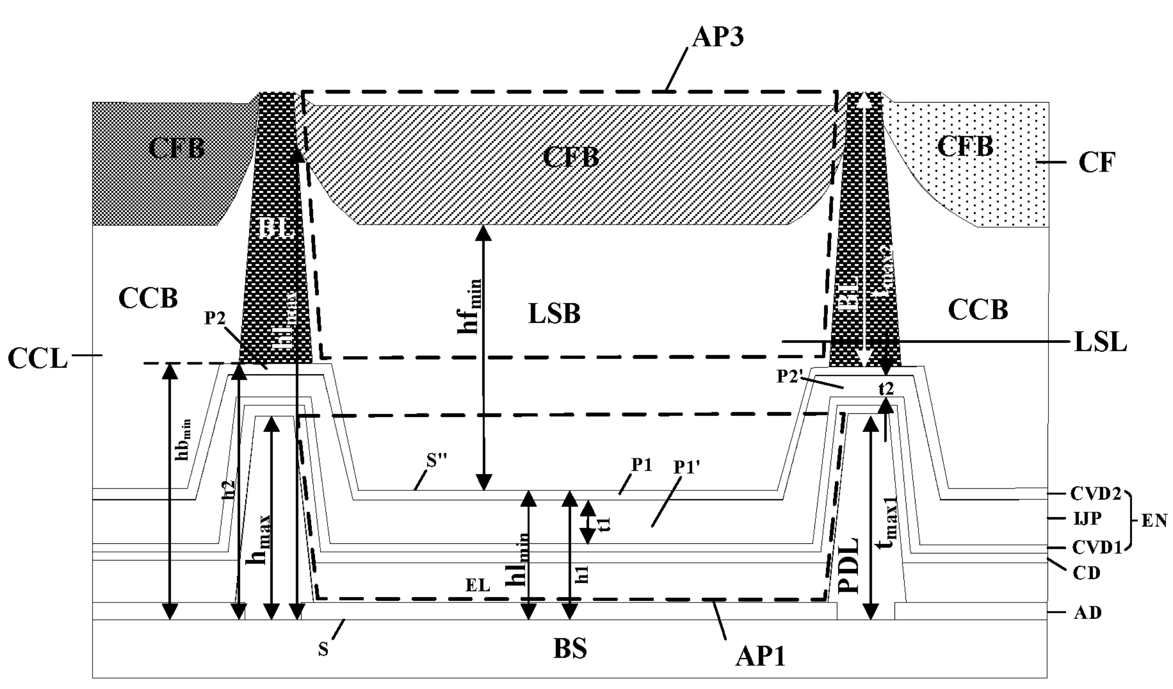
FIG. 11B is a schematic diagram illustrating structural features of the display panel depicted in FIG. 11A.
Figure 11C:
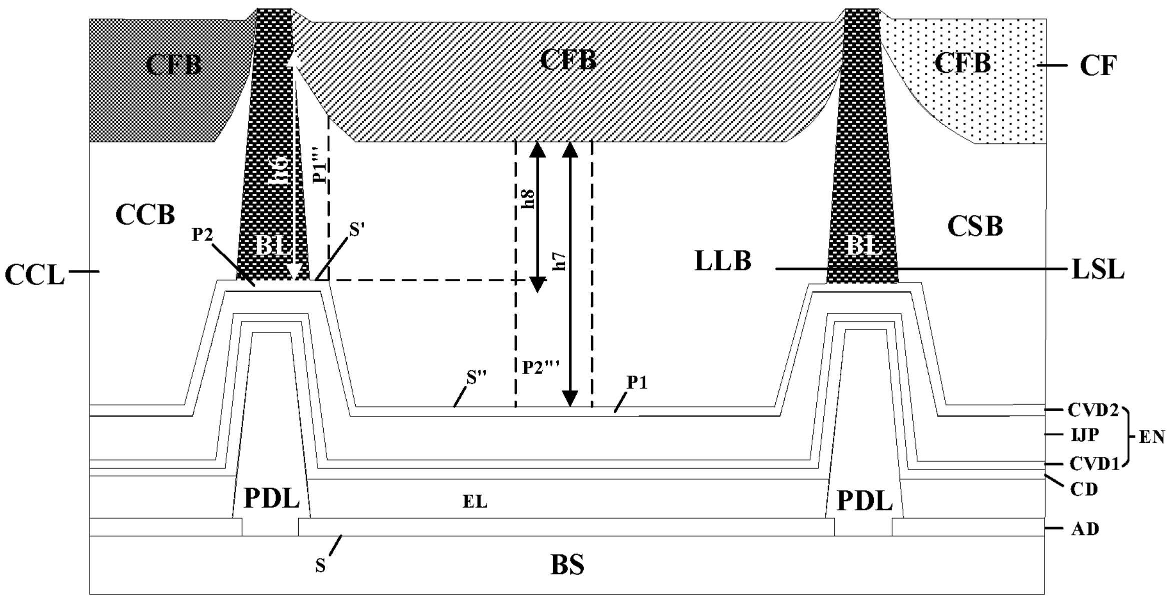
FIG. 11C is a schematic diagram illustrating structural features of the display panel depicted in FIG. 11A.

FIG. 11A is a cross-sectional view of a display panel in some embodiments according to the present disclosure. FIG. 11B is a schematic diagram illustrating structural features of the display panel depicted in FIG. 11A. FIG. 11C is a schematic diagram illustrating structural features of the display panel depicted in FIG. 11A. Referring to FIG. 11A to FIG. 11C, the display panel in some embodiments further includes a plurality of third apertures AP3 extending through the bank layer BL; and a light scattering layer LSL on a side of the second inorganic encapsulating sub-layer CVD2 away from the organic encapsulating sub-layer IJP. Optionally, the light scattering layer LSL is at least partially in the plurality of third apertures AP3.

Referring to FIG. 11A, FIG. 11B, FIG. 8A, FIG. 8B, and FIG. 5, the display panel in some embodiments includes a base substrate BS; a pixel definition layer PDL on the base substrate BS; a plurality of first apertures AP1 extending through the pixel definition layer PDL; a light emitting layer EL at least partially in the plurality of first apertures AP1; an encapsulating layer EN on a side of the pixel definition layer PDL and the light emitting layer EL away from the base substrate BS; a bank layer BL on a side of the encapsulating layer EN away from the base substrate BS; a plurality of second apertures AP2 extending through the bank layer BL; a plurality of third apertures AP3 extending through the bank layer BL; a color conversion layer CCL at least partially in the plurality of second apertures AP2; and a light scattering layer LSL at least partially in the plurality of third apertures AP3.

In some embodiments, the light scattering layer LSL includes a plurality of light scattering blocks LSB. Referring to FIG. 11A to FIG. 11C, in some embodiments, a respective light scattering block of the plurality of light scattering blocks LSB is partially in a respective third aperture of the plurality of third apertures AP3 and partially in an individual first aperture of the plurality of first apertures AP1.

Referring to FIG. 11A and FIG. 11B, in some embodiments, the maximum height $h_{max}$ of the pixel definition layer PDL with respect to the surface S of the base substrate BS is greater than a minimum height $hl_{min}$ of a bottom of the respective light scattering block with respect to the surface S of the base substrate BS. Optionally, a maximum height $hl_{max}$ of a top of the respective light scattering block with respect to the surface S of the base substrate BS is greater than the maximum height $h_{max}$ of the pixel definition layer PDL with respect to the surface S of the base substrate BS.

Referring to FIG. 11A to FIG. 11C, in some embodiments, the respective light scattering block includes a first portion P1''' in direct contact with the bank layer BL, and a second portion P2''' at the center of the area of the individual first aperture. In some embodiments, a maximum height h6 of the first portion P1''' of a respective light scattering block with respect to a surface S' of a second portion P2 of the second inorganic encapsulating sub-layer CVD2 is substantially the same as a maximum height h7 of the second portion P2''' of the respective light scattering block with respect to a surface S'' of the first portion P1 of the second inorganic encapsulating sub-layer CVD2. Optionally, an orthographic projection of the second portion P2 of the second inorganic encapsulating sub-layer CVD2 on the base substrate BS overlaps with an orthographic projection of the pixel definition layer PDL on the base substrate BS.

The inventors of the present disclosure discover that the unique structure of the present display panel, particularly the unique feature of the raised pixel definition layer, results in a substantially uniform thickness of the light scattering block at the center of the first aperture or the third aperture versus at the edge of the third aperture, despite the coffee-ring effect. The light scattering layer has an increased overall thickness, and a substantially uniform thickness.

In some embodiments, a maximum height h8 of the second portion P2''' of the respective light scattering block with respect to the surface S' of the second portion P2 of the second inorganic encapsulating sub-layer CVD2 is less than the maximum height h7 of the second portion P2''' of the respective light scattering block with respect to the surface S'' of the first portion P1 of the second inorganic encapsulating sub-layer CVD2. Optionally, the maximum height h8 is less than the maximum height h7 by at least 1 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

Referring to FIG. 8A, FIG. 8B, FIG. 11A, and FIG. 11B, the display panel in some embodiments further includes a color filter CF on a side of the color conversion layer CCL and the light scattering layer LSL away from the base substrate BS. Optionally, the color filter CF includes a plurality of color filter blocks CFB. Optionally, a first color filter block of the plurality of color filter blocks CFB is at least partially in a respective second aperture of the plurality of second apertures AP2, and in direct contact with a color conversion block. Optionally, a second color filter block of the plurality of color filter blocks CFB is at least partially in a respective third aperture of the plurality of third apertures, and in direct contact with a light scattering block. In one example, a color filter block of a third color (e.g., a blue color) is at least partially in a respective third aperture of the plurality of third apertures AP3, and in direct contact with a light scattering block. In another example, a color filter block of a first color (e.g., a red color) is at least partially in a respective second aperture of the plurality of second apertures AP2, and in direct contact with a color conversion block. In another example, a color filter block of a second color (e.g., a green color) is at least partially in a respective second aperture of the plurality of second apertures AP2, and in direct contact with a color conversion block.

In some embodiments, the plurality of color conversion blocks CCB include a first color conversion block configured to convert a light of a third color (e.g., a blue light) into a light of a first color (e.g., a red light); and a second color conversion block configured to convert a light of a third color (e.g., a blue light) into a light of a second color (e.g., a green light). The plurality of light scattering blocks LSB is configured to scatter the light of the third color (e.g., a blue light). In some embodiments, the plurality of color filter blocks CFB include a color filter block of a first color (e.g., a red color); a color filter block of a second color (e.g., a green color); and a color filter block of a third color (e.g., a blue color). An orthographic projection of the color filter block of the first color on the base substrate at least partially overlaps with an orthographic projection of the first color conversion block on the base substrate; an orthographic projection of the color filter block of the second color on the base substrate at least partially overlaps with an orthographic projection of the second color conversion block on the base substrate; and an orthographic projection of the color filter block of the third color on the base substrate at least partially overlaps with an orthographic projection of the light scattering block on the base substrate.

In some embodiments, the second color conversion block has a thickness greater than a thickness of the first color conversion block, and greater than a thickness of the light scattering block. Optionally, the color filter block of the second color has a thickness less than a thickness of the color filter block of the first color, and less than a thickness of the color filter block of the third color. In some embodiments, a combined thickness of the second color conversion block and the color filter block of the second color is substantially the same as a combined thickness of the first color conversion block and the color filter block of the first color; and is substantially the same as a combined thickness of the light scattering block and the color filter block of the third color. In one example, the second color conversion block includes a plurality of second quantum dots, and the first color conversion block includes a plurality of first quantum dots. Optionally, the plurality of second quantum dots has a lower light conversion efficiency as compared to the plurality of first quantum dots. In another example, the plurality of second quantum dots are a plurality of quantum dots for converting a blue light into a green light, and the plurality of first quantum dots are a plurality of quantum dots for converting a blue light into a red light.

In some embodiments, as shown in FIG. 8A, FIG. 8B, FIG. 11A, and FIG. 11B, a maximum height of the color filter CF with respect to the surface S of the base substrate BS is substantially the same as or less than a maximum height of the bank layer BL with respect to the surface S of the base substrate BS. An orthographic projection of the color filter CF on the base substrate BS is at least partially non-overlapping with an orthographic projection of the bank layer BL on the base substrate BS.

In some embodiments, a minimum height $hb_{min}$ of a bottom of the bank layer BL with respect to the surface S of the base substrate BS is greater than a minimum height $hl_{min}$ of a bottom of the respective light scattering block with respect to the surface S of the base substrate BS by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

Figure 8E:
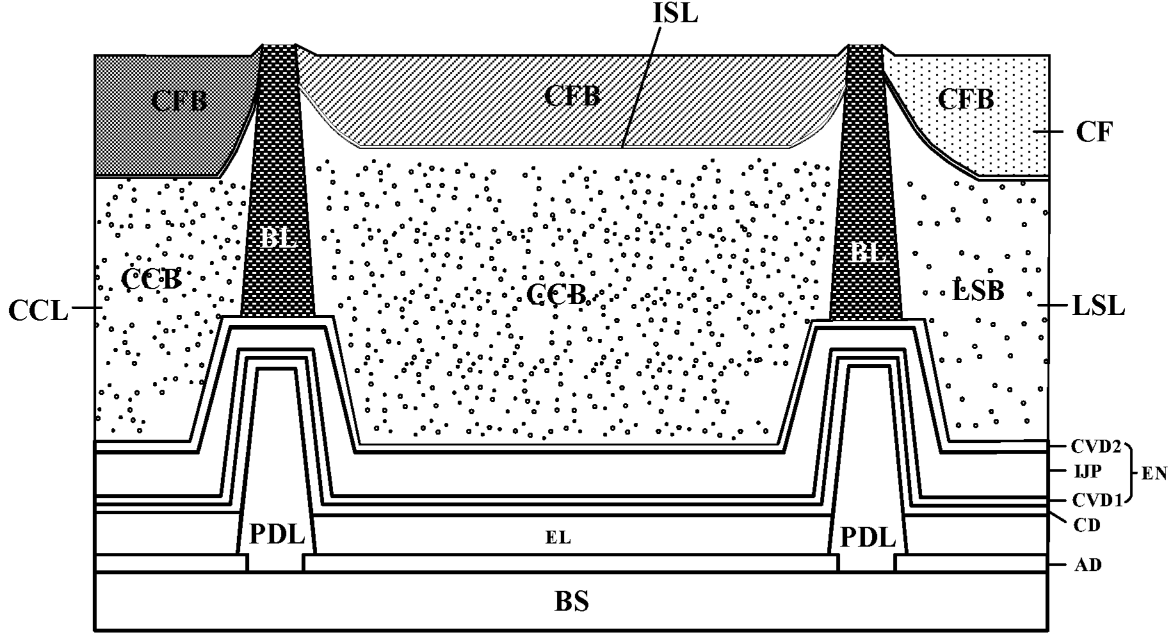
FIG. 8E is a cross-sectional view of a display panel in some embodiments according to the present disclosure.
Figure 11D:
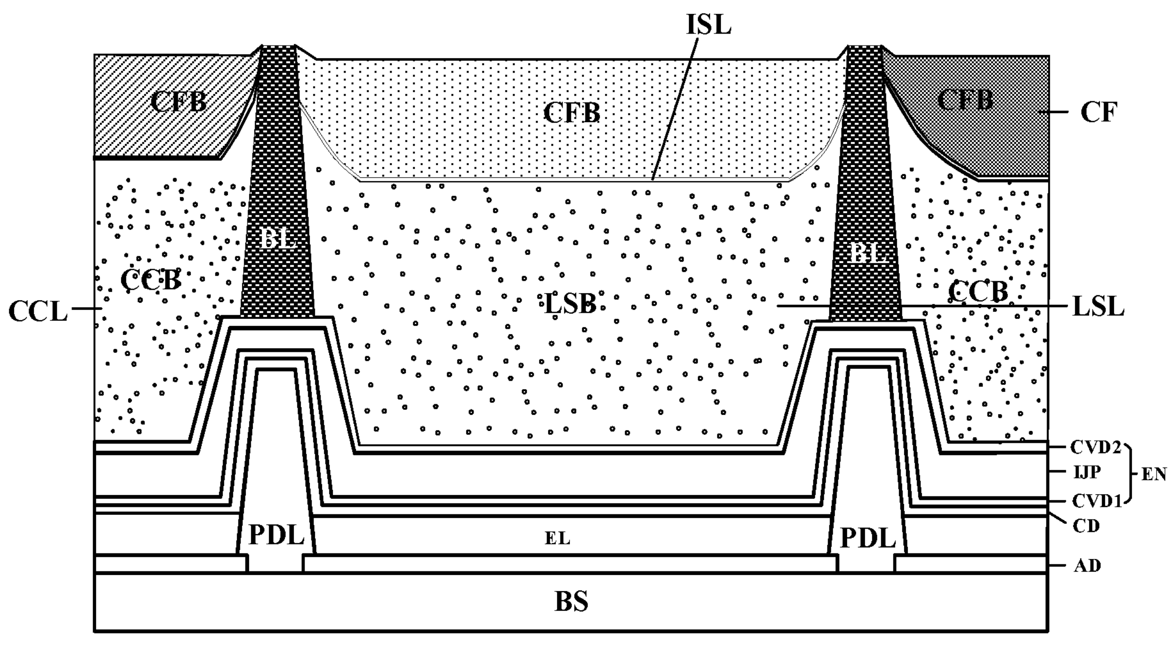
FIG. 11D is a cross-sectional view of a display panel in some embodiments according to the present disclosure.

FIG. 8E is a cross-sectional view of a display panel in some embodiments according to the present disclosure. FIG. 11D is a cross-sectional view of a display panel in some embodiments according to the present disclosure. Referring to FIG. 8E and FIG. 11D, the display panel in some embodiments further includes an inorganic separation layer ISL on a side of the color conversion layer CCL and the light scattering layer LSL away from the base substrate BS, and on a side of the color filter CF closer to the base substrate BS. The inorganic separation layer ISL spaces apart the color filter CF and the color conversion layer CCL, and spaces apart the color filter CF and the light scattering layer LSL. Optionally, the inorganic separation layer ISL is in direct contact with the color filter CF. Optionally, the inorganic separation layer ISL is in direct contact with the color conversion layer CCL. Optionally, the inorganic separation layer ISL is in direct contact with the light scattering layer LSL.

Figure 12:
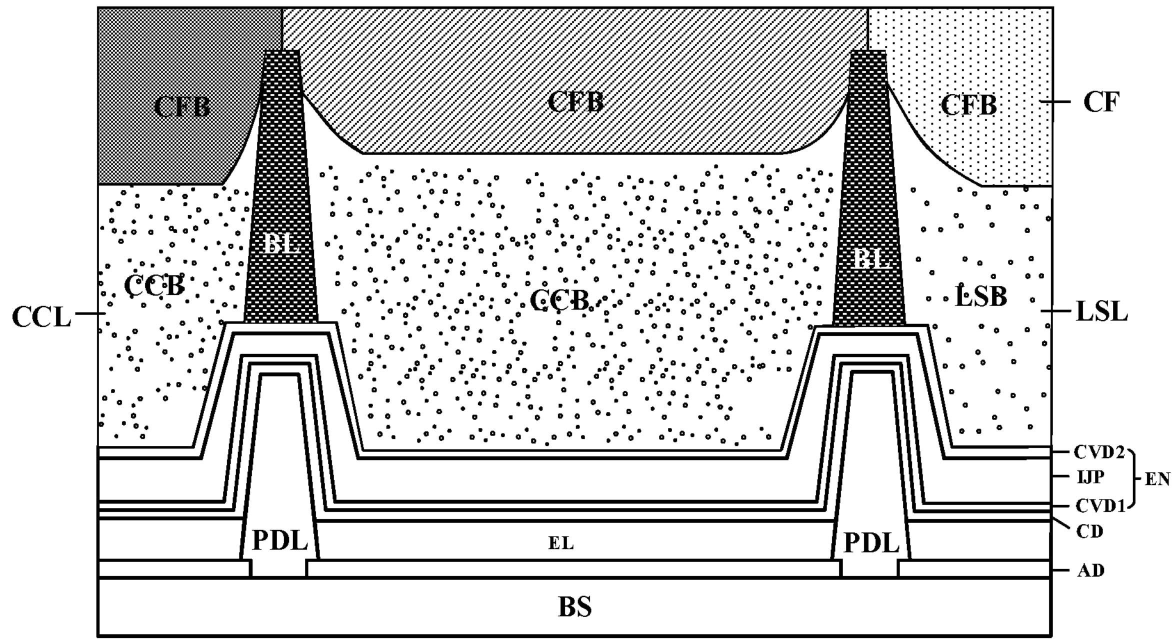
FIG. 12 is a cross-sectional view of a display panel in some embodiments according to the present disclosure.

FIG. 12 is a cross-sectional view of a display panel in some embodiments according to the present disclosure. Referring to FIG. 12, in some embodiments, a maximum height of the color filter CF with respect to the surface S of the base substrate BS is greater than a maximum height of the bank layer BL with respect to the surface S of the base substrate BS. Optionally, an orthographic projection of the color filter CF on the base substrate BS covers an orthographic projection of the bank layer BL on the base substrate BS. A respective ridge of the bank layer BL between two adjacent subpixels is covered by two adjacent color filter blocks of the plurality of color filter blocks CFB.

Figure 13A:
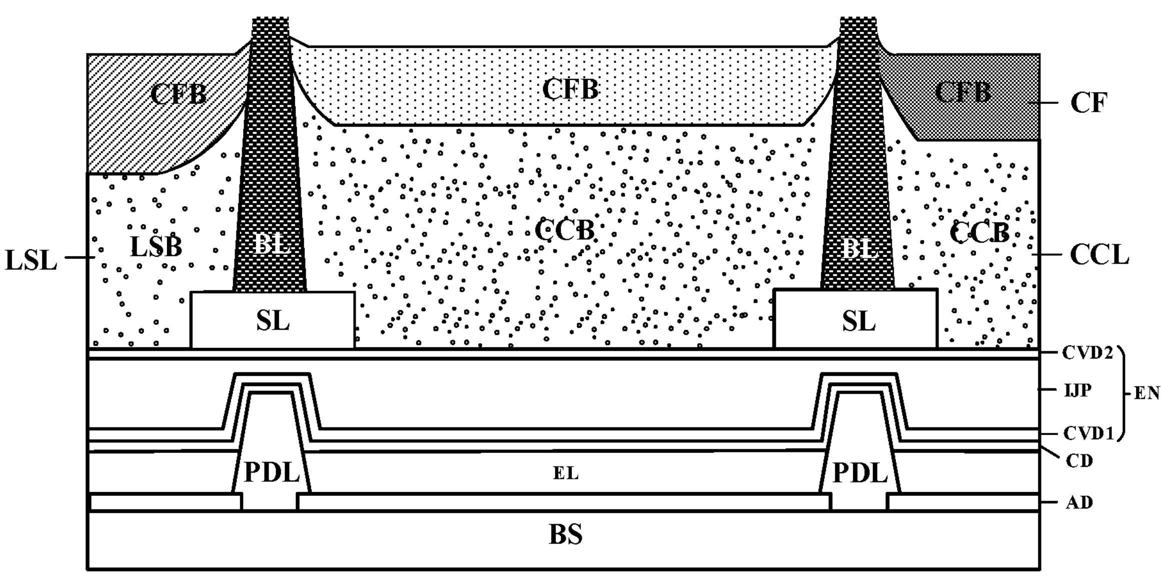
FIG. 13A is a cross-sectional view of a display panel in some embodiments according to the present disclosure.
Figure 13B:
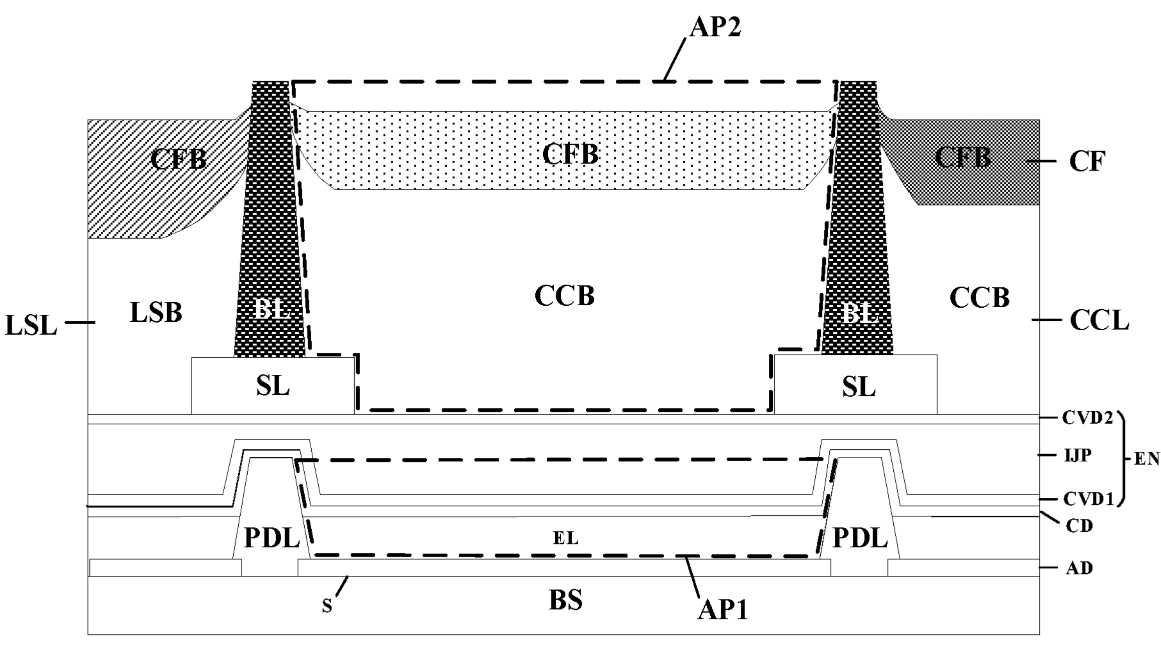
FIG. 13B is a schematic diagram illustrating structural features of the display panel depicted in FIG. 13A.
Figure 13C:
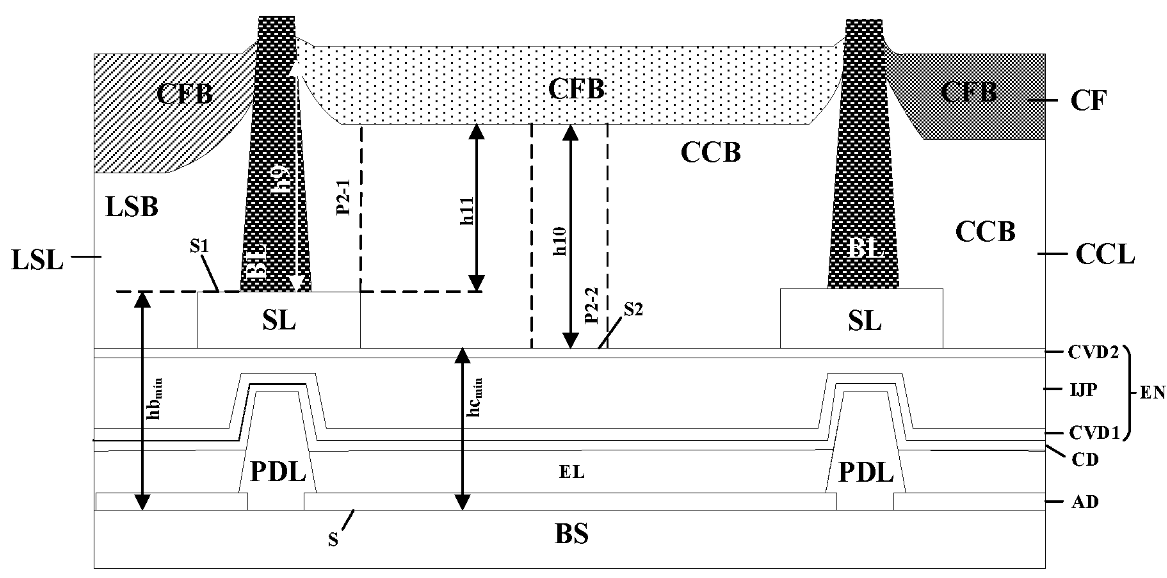
FIG. 13C is a schematic diagram illustrating structural features of the display panel depicted in FIG. 13A.

FIG. 13A is a cross-sectional view of a display panel in some embodiments according to the present disclosure. FIG. 13B is a schematic diagram illustrating structural features of the display panel depicted in FIG. 13A. FIG. 13C is a schematic diagram illustrating structural features of the display panel depicted in FIG. 13A. Referring to FIG. 13A to FIG. 13C, the display panel in some embodiments includes a base substrate BS; a pixel definition layer PDL on the base substrate BS; a plurality of first apertures AP1 extending through the pixel definition layer PDL; a light emitting layer EL at least partially in the plurality of first apertures AP1; an encapsulating layer EN on a side of the pixel definition layer PDL and the light emitting layer EL away from the base substrate BS; a support layer SL on a side of the encapsulating layer EN away from the base substrate BS; a bank layer BL on a side of the support layer SL away from the encapsulating layer EN; a plurality of second apertures AP2 extending through the bank layer BL and the support layer SL; and a color conversion layer CCL at least partially in the plurality of second apertures AP2. The inventors of the present disclosure discover that, by having the support layer SL, the color conversion color CCL has an increased overall thickness, effectively enhancing light conversion efficiency in the color conversion layer CCL.

In some embodiments, the support layer SL includes a light absorbing material. Optionally, the support layer SL includes a blue light orbing material. Optionally, the support layer SL includes a light absorbing material capable of at least partially absorbing blue light and green light. Optionally, the support layer SL includes a light absorbing material capable of at least partially absorbing red light, blue light, and green light. The inventors of the present disclosure discover that the light absorbing material in the support layer SL can effectively prevent light leakage between adjacent subpixels.

In some embodiments, the support layer SL includes a light reflecting material. Optionally, the support layer SL includes a metallic light reflecting material. The inventors of the present disclosure discover that the light reflecting material in the support layer SL can effectively prevent light leakage between adjacent subpixels.

The support layer SL may have various appropriate shapes. In some embodiments, in a cross-section plane perpendicular to a surface S of the base substrate and intersecting the bank layer, the pixel definition layer, and multiple adjacent color conversion blocks of the color conversion layer, a cross-section of the support layer SL has a rectangular shape, a trapezoidal shape, a regular polygonal shape, or an irregular polygonal shape.

When the cross-section of the support layer SL has a trapezoidal shape, a regular polygonal shape, or an irregular polygonal shape, the cross-section has a first side closer to the base substrate BS, and a second side on a side of the first side away from the base substrate BS. Optionally, the first side is shorter than the second side. This unique structural feature of the support layer SL is conducive for reflecting the light entering the second aperture toward a direction away from the base substrate and emitting out of the display panel.

In some embodiments, a minimum height $hb_{min}$ in of a bottom of the bank layer BL with respect to the surface S of the base substrate BS is greater than a minimum height $hc_{min}$ of a bottom of the respective color conversion block with respect to the surface S of the base substrate BS by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

Figure 14:
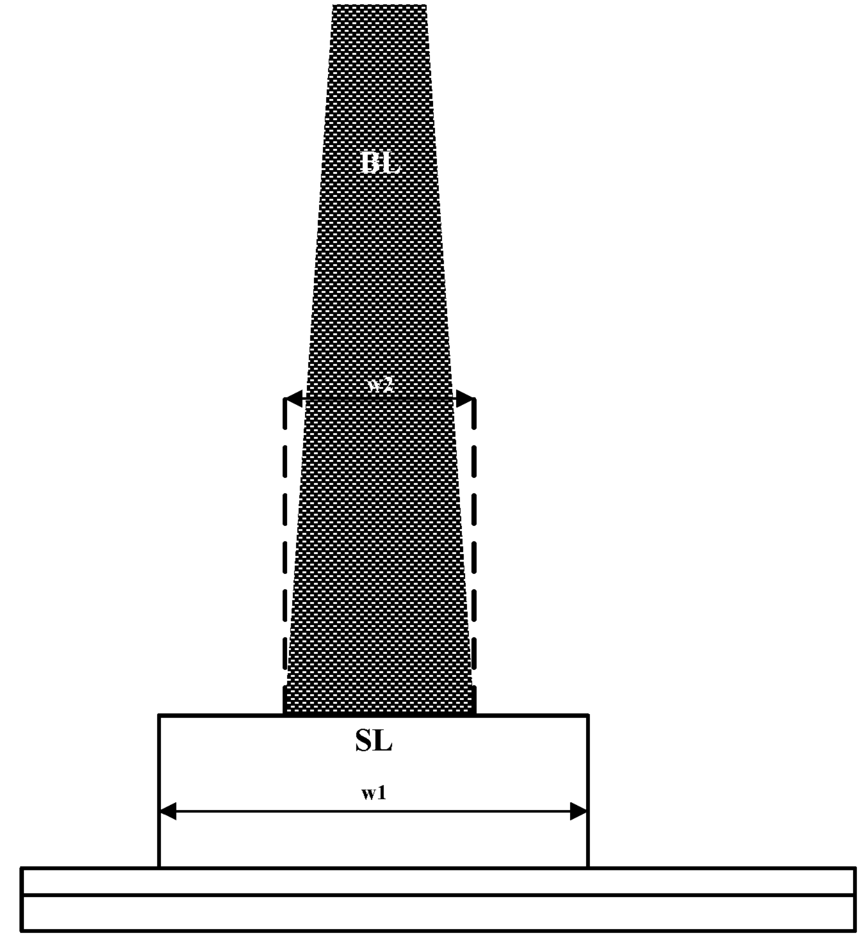
FIG. 14 is a cross-sectional view illustrating structure features of a bank layer in some embodiments according to the present disclosure.

FIG. 14 is a cross-sectional view illustrating structure features of a bank layer in some embodiments according to the present disclosure. Referring to FIG. 14, FIG. 13A, and FIG. 13B, in a cross-section plane perpendicular to the surface S of the base substrate BS and intersecting the bank layer BL, the support layer SL, the pixel definition layer PDL, and multiple adjacent color conversion blocks of the color conversion layer CCL, a maximum width w1 of the support layer SL is greater than a maximum width w2 of the bank layer BL. The inventors of the present disclosure discover that, by having the maximum width w1 of the support layer SL greater than a maximum width w2 of the bank layer BL, the issue of the bank layer BL collapsing at the edge of the underlying protrusion of the support layer SL can be effectively prevented.

Figure 15:
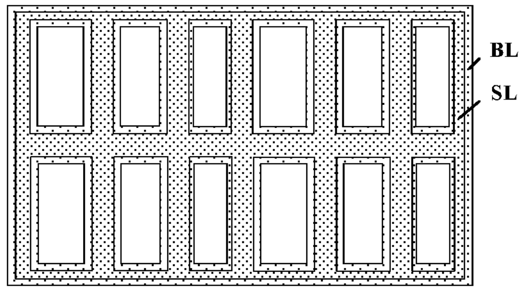
FIG. 15 a plan view illustrating the structure of a bank layer and a support layer in some embodiments according to the present disclosure.

FIG. 15 a plan view illustrating the structure of a bank layer and a support layer in some embodiments according to the present disclosure. Referring to FIG. 15, in some embodiments, an orthographic projection of the support layer SL on the base substrate covers an orthographic projection of the bank layer BL on the base substrate.

In some embodiments, the support layer SL has a thickness of at least 1 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

Referring to FIG. 13A to FIG. 13C, in some embodiments, the color conversion layer CCL includes a plurality of color conversion blocks CCB. A respective color conversion block of the plurality of color conversion blocks CCB includes a first portion P2-1 in direct contact with the support layer SL, and a second portion P2-2 at a center of the area of a respective second aperture of the plurality of second apertures AP2. In some embodiments, a maximum height h9 of the first portion P2-1 of a respective color conversion block with respect to a surface S1 of the support layer SL is substantially the same as a maximum height h10 of the second portion P2-2 of the respective color conversion block with respect to a surface S2 of a portion of the second inorganic encapsulating sub-layer CVD2 at the center of the area of the respective second aperture.

The inventors of the present disclosure discover that the unique structure of the present display panel, particularly the unique feature of the support layer, results in a substantially uniform thickness of the color conversion block at the center of the first aperture or the second aperture versus at the edge of the second aperture, despite the coffee-ring effect. The color conversion layer has an increased overall thickness, a substantially uniform thickness, an increased light conversion efficiency, leading to a decreased light leakage between adjacent subpixels.

In some embodiments, a maximum height h11 of the second portion P2" of the respective color conversion block with respect to the surface S1 of the support layer SL is less than the maximum height h10 of the second portion P2-2 of the respective color conversion block with respect to the surface S2 of the portion of the second inorganic encapsulating sub-layer CVD2 at the center of the area of the respective first aperture. Optionally, the maximum height h11 is less than the maximum height h10 by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

Figure 16A:
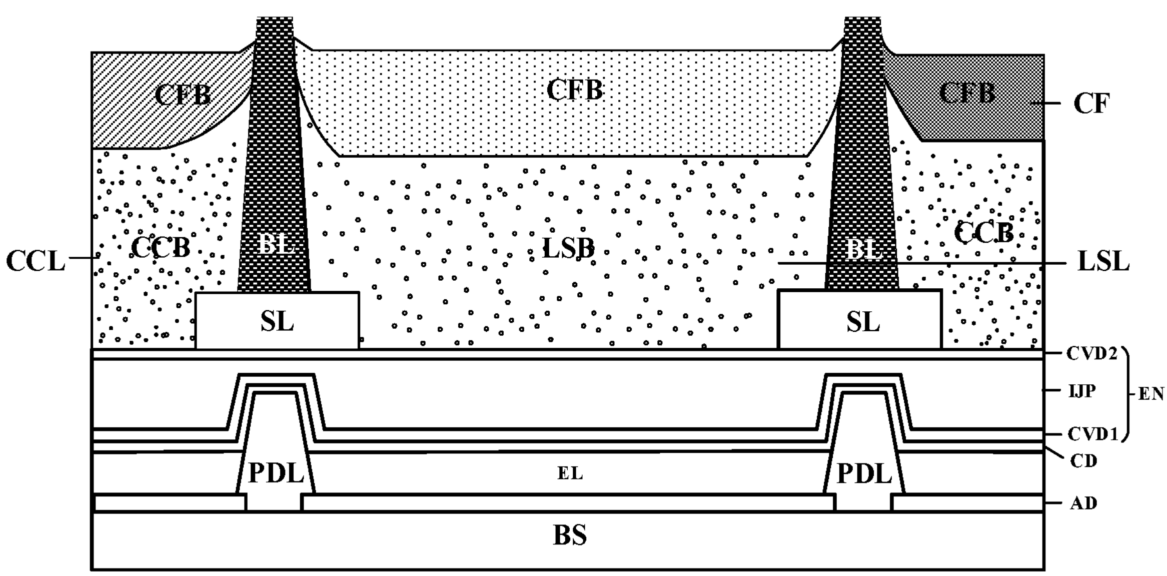
FIG. 16A is a cross-sectional view of a display panel in some embodiments according to the present disclosure.
Figure 16B:
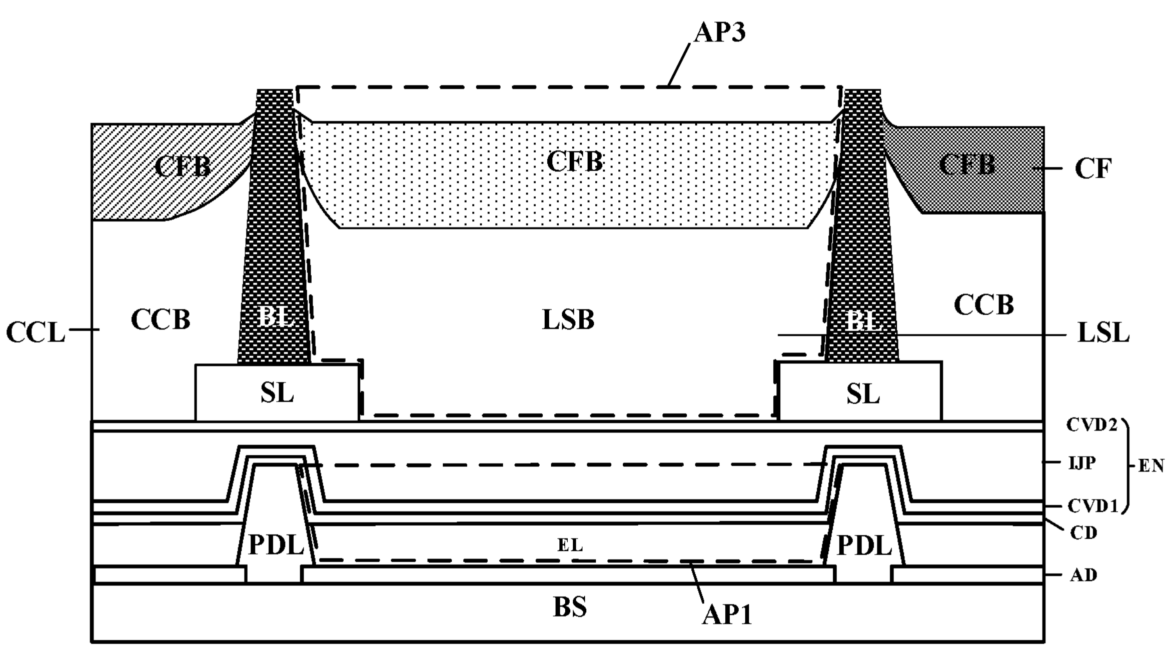
FIG. 16B is a schematic diagram illustrating structural features of the display panel depicted in FIG. 16A.
Figure 16C:
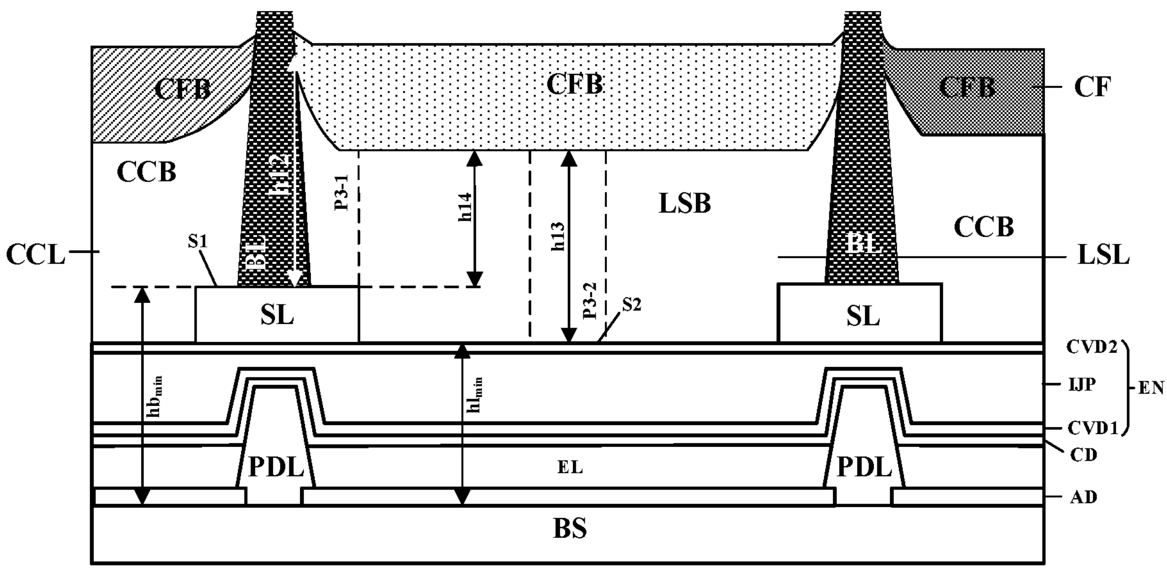
FIG. 16C is a schematic diagram illustrating structural features of the display panel depicted in FIG. 16A.

FIG. 16A is a cross-sectional view of a display panel in some embodiments according to the present disclosure. FIG. 16B is a schematic diagram illustrating structural features of the display panel depicted in FIG. 16A. FIG. 16C is a schematic diagram illustrating structural features of the display panel depicted in FIG. 16A. Referring to FIG. 16A to FIG. 16C, the display panel in some embodiments further includes a plurality of third apertures AP3 extending through the bank layer BL and the support layer SL; and a light scattering layer LSL on a side of the second inorganic encapsulating sub-layer CVD2 away from the organic encapsulating sub-layer IJP. Optionally, the light scattering layer LSL is at least partially in the plurality of third apertures AP3. Optionally, the light scattering layer LSL includes a plurality of light scattering blocks LSB.

Referring to FIG. 16A, FIG. 16B, FIG. 15A, and FIG. 15B, the display panel in some embodiments includes a base substrate BS; a pixel definition layer PDL on the base substrate BS; a plurality of first apertures AP1 extending through the pixel definition layer PDL; a light emitting layer EL at least partially in the plurality of first apertures AP1; an encapsulating layer EN on a side of the pixel definition layer PDL and the light emitting layer EL away from the base substrate BS; a support layer SL on a side of the encapsulating layer EN away from the base substrate BS; a bank layer BL on a side of the support layer SL away from the encapsulating layer EN; a plurality of second apertures AP2 extending through the bank layer BL and the support layer SL; a plurality of third apertures AP3 extending through the bank layer BL and the support layer SL; a color conversion layer CCL at least partially in the plurality of second apertures AP2; and a light scattering layer LSL at least partially in the plurality of third apertures AP3.

In some embodiments, the light scattering layer LSL includes a plurality of light scattering blocks LSB. Referring to FIG. 16A to FIG. 16C, in some embodiments, a respective light scattering block of the plurality of light scattering blocks LSB is partially in a respective third aperture of the plurality of third apertures AP3 and partially in an individual first aperture of the plurality of first apertures AP1.

Referring to FIG. 16A to FIG. 16C, in some embodiments, the light scattering layer LSL includes a plurality of light scattering blocks LSB. A respective light scattering block of the plurality of light scattering blocks LSB includes a first portion P3-1 in direct contact with the support layer SL, and a second portion P3-2 at a center of the area of a respective third aperture of the plurality of third apertures AP3. In some embodiments, a maximum height h12 of the first portion P3-1 of a respective light scattering block with respect to a surface S1 of the support layer SL is substantially the same as a maximum height h13 of the second portion P3-2 of the respective light scattering block with respect to a surface S2 of a portion of the second inorganic encapsulating sub-layer CVD2 at the center of the area of the respective third aperture.

The inventors of the present disclosure discover that the unique structure of the present display panel, particularly the unique feature of the support layer, results in a substantially uniform thickness of the light scattering block at the center of the first aperture or the third aperture versus at the edge of the third aperture, despite the coffee-ring effect. The light scattering layer has an increased overall thickness and a substantially uniform thickness.

In some embodiments, a maximum height h14 of the second portion P3-2 of the respective light scattering block with respect to the surface S1 of the support layer SL is less than the maximum height h13 of the second portion P3-2 of the respective light scattering block with respect to the surface S2 of the portion of the second inorganic encapsulating sub-layer CVD2 at the center of the area of a respective third aperture of a plurality of third apertures AP3. Optionally, the maximum height h14 is less than the maximum height h13 by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

Referring to FIG. 13A, FIG. 13B, FIG. 16A, and FIG. 16B, the display panel in some embodiments further includes a color filter CF on a side of the color conversion layer CCL and the light scattering layer LSL away from the base substrate BS. Optionally, the color filter CF includes a plurality of color filter blocks CFB. Optionally, a first color filter block of the plurality of color filter blocks CFB is at least partially in a respective second aperture of the plurality of second apertures AP2, and in direct contact with a color conversion block. Optionally, a second color filter block of the plurality of color filter blocks CFB is at least partially in a respective third aperture of the plurality of third apertures, and in direct contact with a light scattering block. In one example, a color filter block of a third color (e.g., a blue color) is at least partially in a respective third aperture of the plurality of third apertures AP3, and in direct contact with a light scattering block. In another example, a color filter block of a first color (e.g., a red color) is at least partially in a respective second aperture of the plurality of second apertures AP2, and in direct contact with a color conversion block. In another example, a color filter block of a second color (e.g., a green color) is at least partially in a respective second aperture of the plurality of second apertures AP2, and in direct contact with a color conversion block.

In some embodiments, the plurality of color conversion blocks CCB include a first color conversion block configured to convert a light of a third color (e.g., a blue light) into a light of a first color (e.g., a red light); and a second color conversion block configured to convert a light of a third color (e.g., a blue light) into a light of a second color (e.g., a green light). The plurality of light scattering blocks LSB is configured to scatter the light of the third color (e.g., a blue light). In some embodiments, the plurality of color filter blocks CFB include a color filter block of a first color (e.g., a red color); a color filter block of a second color (e.g., a green color); and a color filter block of a third color (e.g., a blue color). An orthographic projection of the color filter block of the first color on the base substrate at least partially overlaps with an orthographic projection of the first color conversion block on the base substrate; an orthographic projection of the color filter block of the second color on the base substrate at least partially overlaps with an orthographic projection of the second color conversion block on the base substrate; and an orthographic projection of the color filter block of the third color on the base substrate at least partially overlaps with an orthographic projection of the light scattering block on the base substrate.

In some embodiments, the second color conversion block has a thickness greater than a thickness of the first color conversion block, and greater than a thickness of the light scattering block. Optionally, the color filter block of the second color has a thickness less than a thickness of the color filter block of the first color, and less than a thickness of the color filter block of the third color. In some embodiments, a combined thickness of the second color conversion block and the color filter block of the second color is substantially the same as a combined thickness of the first color conversion block and the color filter block of the first color; and is substantially the same as a combined thickness of the light scattering block and the color filter block of the third color. In one example, the second color conversion block includes a plurality of second quantum dots, and the first color conversion block includes a plurality of first quantum dots. Optionally, the plurality of second quantum dots has a lower light conversion efficiency as compared to the plurality of first quantum dots. In another example, the plurality of second quantum dots are a plurality of quantum dots for converting a blue light into a green light, and the plurality of first quantum dots are a plurality of quantum dots for converting a blue light into a red light.

In some embodiments, as shown in FIG. 13A, FIG. 13B, FIG. 16A, and FIG. 16B, a maximum height of the color filter CF with respect to the surface S of the base substrate BS is substantially the same as or less than a maximum height of a combination of the bank layer BL and the support layer SL with respect to the surface S of the base substrate BS. An orthographic projection of the color filter CF on the base substrate BS is at least partially non-overlapping with an orthographic projection of the support layer SL and the bank layer BL on the base substrate BS.

In some embodiments, a minimum height $hb_{min}$ of a bottom of the bank layer BL with respect to the surface S of the base substrate BS is greater than a minimum height $hl_{min}$ of a bottom of the respective light scattering block with respect to the surface S of the base substrate BS by at least 1 μm, e.g., by at least 1.0 μm, e.g., 1.0 μm to 1.5 μm, 1.5 μm to 2.0 μm, 2.0 μm to 2.5 μm, 2.5 μm to 3.0 μm, 3.0 μm to 3.5 μm, 3.5 μm to 4.0 μm, 4.0 μm to 4.5 μm, or 4.5 μm to 5.0 μm.

Figure 17:
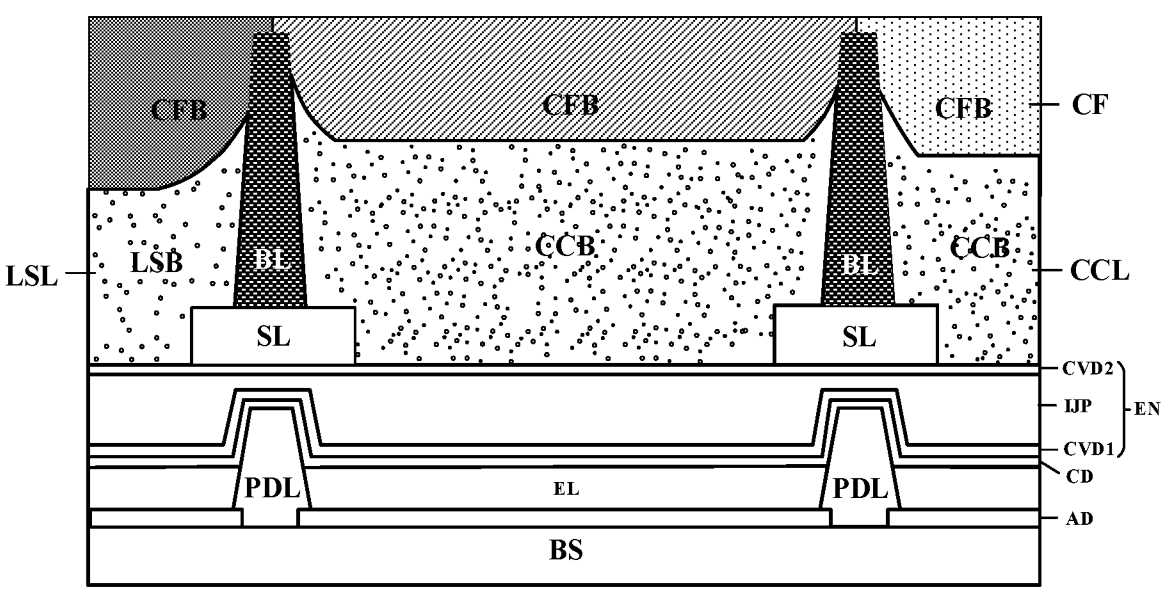
FIG. 17 is a cross-sectional view of a display panel in some embodiments according to the present disclosure.

FIG. 17 is a cross-sectional view of a display panel in some embodiments according to the present disclosure. Referring to FIG. 17, in some embodiments, a maximum height of the color filter CF with respect to the surface S of the base substrate BS is greater than a maximum height of the combination of the bank layer BL and the support layer SL with respect to the surface S of the base substrate BS. Optionally, an orthographic projection of the color filter CF on the base substrate BS covers an orthographic projection of the support layer SL and the bank layer BL on the base substrate BS. A respective ridge of the bank layer BL between two adjacent subpixels is covered by two adjacent color filter blocks of the plurality of color filter blocks CFB.

Figure 18A:
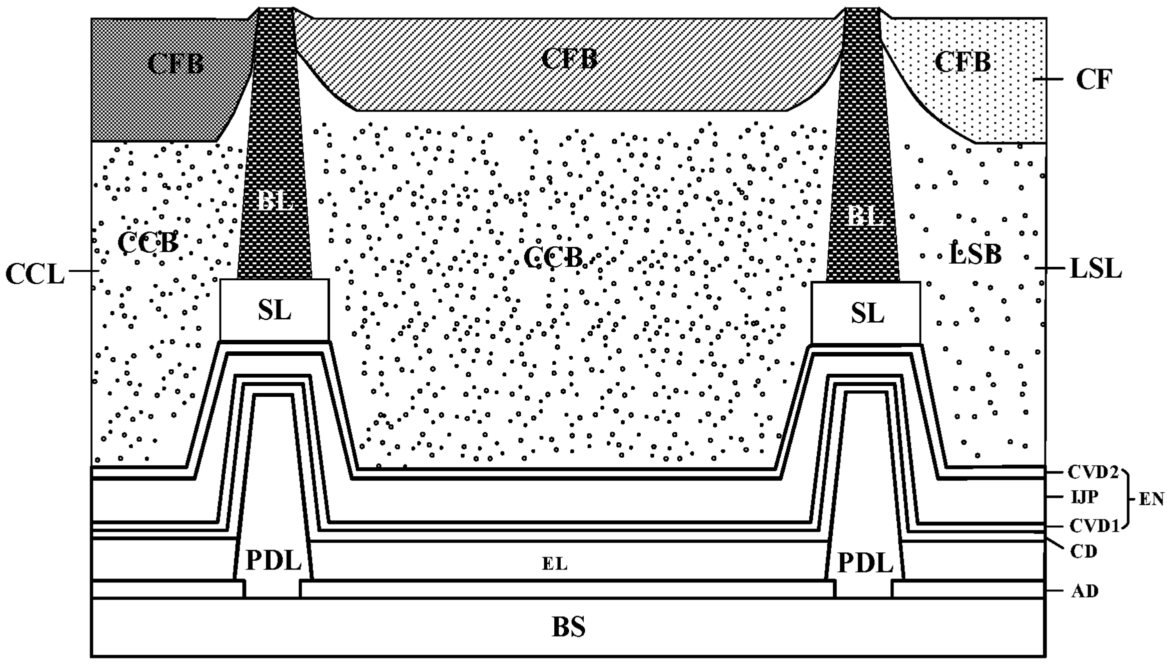
FIG. 18A is a cross-sectional view of a display panel in some embodiments according to the present disclosure.
Figure 18B:
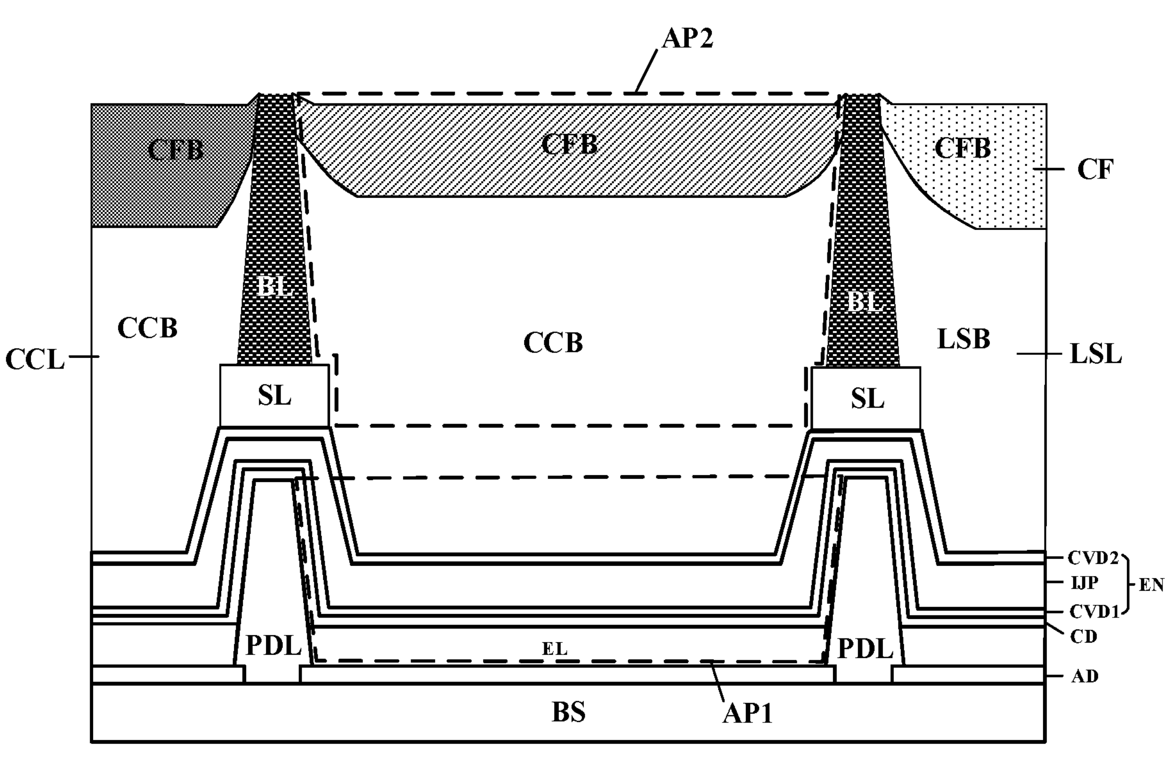
FIG. 18B is a schematic diagram illustrating structural features of the display panel depicted in FIG. 18A.
Figure 19A:
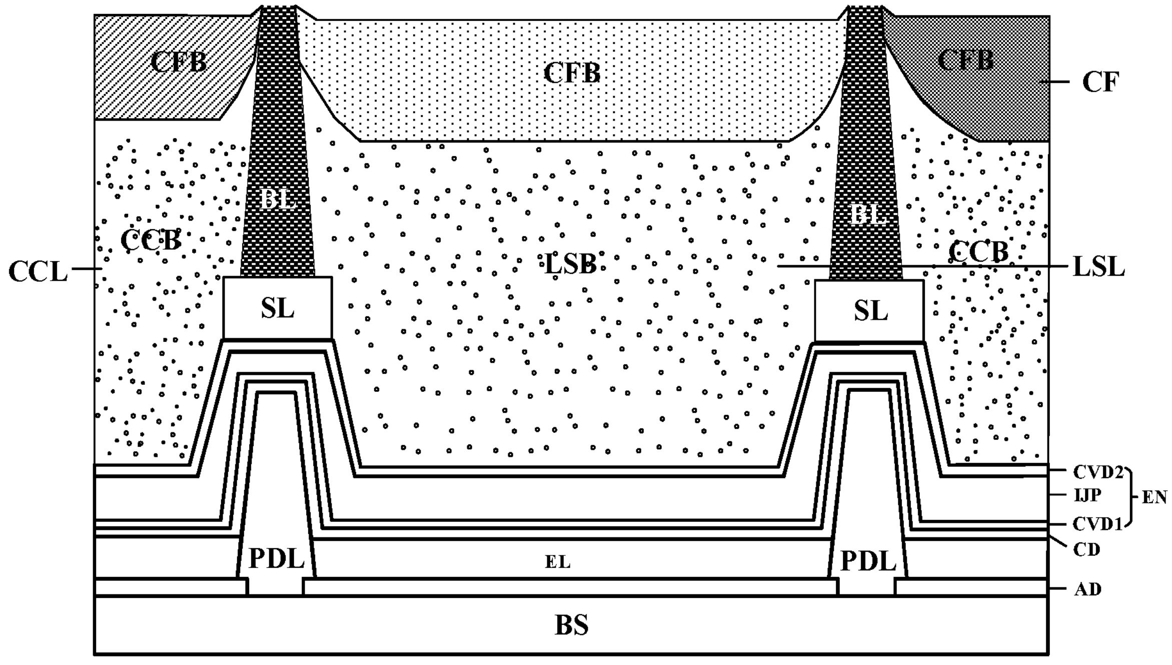
FIG. 19A is a cross-sectional view of a display panel in some embodiments according to the present disclosure.
Figure 19B:
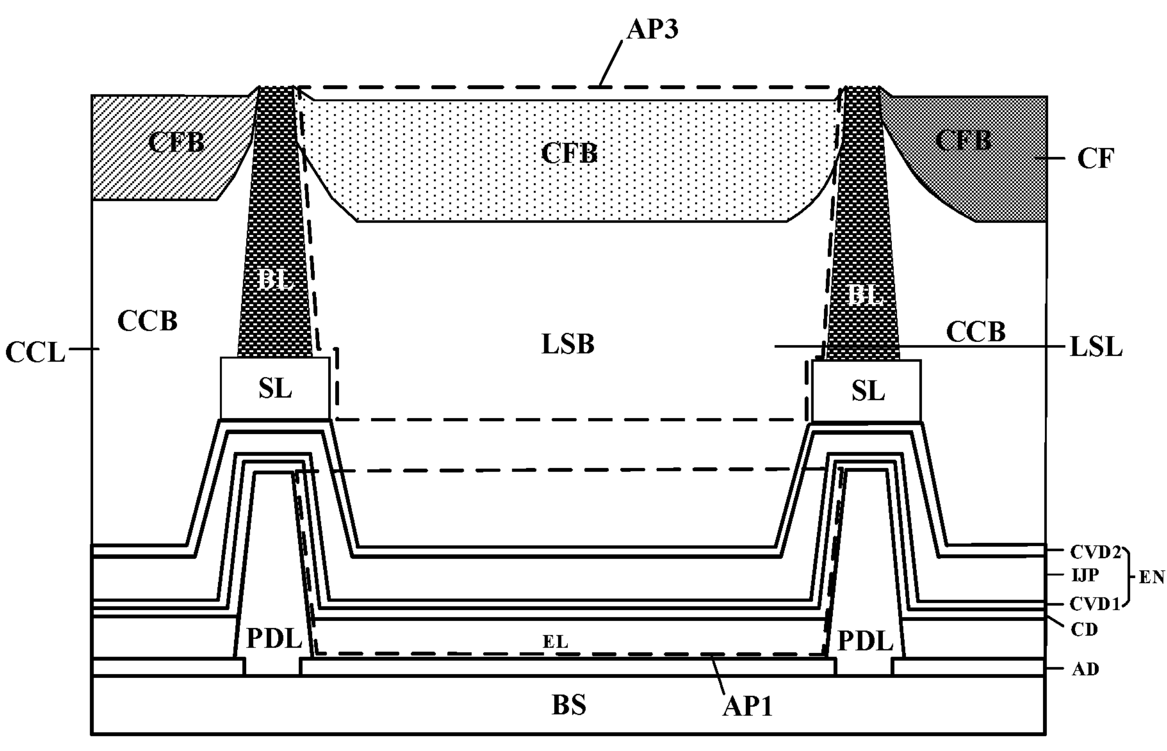
FIG. 19B is a schematic diagram illustrating structural features of the display panel depicted in FIG. 19A.

FIG. 18A is a cross-sectional view of a display panel in some embodiments according to the present disclosure. FIG. 18B is a schematic diagram illustrating structural features of the display panel depicted in FIG. 18A. FIG. 19A is a cross-sectional view of a display panel in some embodiments according to the present disclosure. FIG. 19B is a schematic diagram illustrating structural features of the display panel depicted in FIG. 19A. Referring to FIG. 18A, FIG. 18B, FIG. 19A and FIG. 19B, the display panel in some embodiments includes a base substrate BS; a pixel definition layer PDL on the base substrate BS; a plurality of first apertures AP1 extending through the pixel definition layer PDL; a light emitting layer EL at least partially in the plurality of first apertures AP1; an encapsulating layer EN on a side of the pixel definition layer PDL and the light emitting layer EL away from the base substrate BS; a support layer SL on a side of the encapsulating layer EN away from the base substrate BS; a bank layer BL on a side of the support layer SL away from the encapsulating layer EN; a plurality of second apertures AP2 extending through the bank layer BL and the support layer SL; a plurality of third apertures AP3 extending through the bank layer BL and the support layer SL; a color conversion layer CCL at least partially in the plurality of second apertures AP2; and a light scattering layer LSL at least partially in the plurality of third apertures AP3.

In some embodiments, the color conversion layer CCL includes a plurality of color conversion blocks CCB. Referring to FIG. 8A to FIG. 8C, in some embodiments, a respective color conversion block of the plurality of color conversion blocks CCB is partially in a respective second aperture of the plurality of second apertures AP2 and partially in the respective first aperture of the plurality of first apertures AP1.

In some embodiments, the light scattering layer LSL includes a plurality of light scattering blocks LSB. Referring to FIG. 11A to FIG. 11C, in some embodiments, a respective light scattering block of the plurality of light scattering blocks LSB is partially in a respective third aperture of the plurality of third apertures AP3 and partially in an individual first aperture of the plurality of first apertures AP1.

In some embodiments, the support layer SL includes a light absorbing material. Optionally, the support layer SL includes a blue light orbing material. Optionally, the support layer SL includes a light absorbing material capable of at least partially absorbing blue light and green light. Optionally, the support layer SL includes a light absorbing material capable of at least partially absorbing red light, blue light, and green light. In some embodiments, the support layer SL includes a light reflecting material. Optionally, the support layer SL includes a metallic light reflecting material.

In some embodiments, a maximum height of the pixel definition layer PDL with respect to a surface of the base substrate BS is greater than a height of a first portion of the second inorganic encapsulating sub-layer CVD2 at a center of an area of a respective first aperture of the plurality of first apertures AP1 with respect to the surface of the base substrate BS. In one example, the maximum height is greater than the height by at least 1.0 μm. In some embodiments, a ratio of a maximum thickness of the pixel definition layer PDL to a maximum thickness of a combination of the bank layer BL and the support layer SL is in a range of 0.07 to 0.56. Optionally, the ratio of a maximum thickness of the pixel definition layer PDL to a maximum thickness of a combination of the bank layer BL and the support layer SL is greater than 0.2.

In some embodiments, the maximum height of the pixel definition layer PDL with respect to the surface of the base substrate BS is greater than a minimum height of a bottom of the respective color conversion block with respect to the surface of the base substrate BS. Optionally, a maximum height of a top of the respective color conversion block with respect to the surface of the base substrate BS is greater than the maximum height of the pixel definition layer PDL with respect to the surface S of the base substrate BS.

In some embodiments, a maximum height of a second portion of the second inorganic encapsulating sub-layer CVD2 with respect to the surface of the base substrate BS is greater than the height of the first portion of the second inorganic encapsulating sub-layer CVD2 at the center of the area of the respective first aperture with respect to the surface of the base substrate BS by at least 1 μm. Optionally, an orthographic projection of the second portion of the second inorganic encapsulating sub-layer CVD2 on the base substrate BS overlaps with an orthographic projection of the pixel definition layer PDL on the base substrate BS.

In some embodiments, a thickness of a first portion of the organic encapsulating sub-layer IJP at the center of the area of the respective first aperture is greater than a thickness of a second portion of the organic encapsulating sub-layer IJP. Optionally, an orthographic projection of the second portion of the organic encapsulating sub-layer IP on the base substrate BS overlaps with an orthographic projection of the pixel definition layer PDL on the base substrate BS.

In some embodiments, the color conversion layer CCL includes a plurality of color conversion blocks CCB. A respective color conversion block of the plurality of color conversion blocks CCB includes a first portion in direct contact with the support layer SL, and a second portion at a center of the area of a respective second aperture of the plurality of second apertures AP2. In some embodiments, a maximum height of the first portion of a respective color conversion block with respect to a surface of the support layer SL is substantially the same as a maximum height of the second portion of the respective color conversion block with respect to a surface of a portion of the second inorganic encapsulating sub-layer CVD2 at the center of the area of the respective second aperture.

In some embodiments, a maximum height of the second portion of the respective color conversion block with respect to the surface of the support layer SL is less than the maximum height of the second portion of the respective color conversion block with respect to the surface of the portion of the second inorganic encapsulating sub-layer CVD2 at the center of the area of the respective first aperture.

In some embodiments, the maximum height of the pixel definition layer PDL with respect to the surface of the base substrate BS is greater than a minimum height of a bottom of the respective light scattering block with respect to the surface of the base substrate BS. Optionally, a maximum height of a top of the respective light scattering block with respect to the surface of the base substrate BS is greater than the maximum height of the pixel definition layer PDL with respect to the surface of the base substrate BS.

In some embodiments, the respective light scattering block of the plurality of light scattering blocks LSB includes a first portion in direct contact with the support layer SL, and a second portion at a center of the area of a respective third aperture of the plurality of third apertures AP3. In some embodiments, a maximum height of the first portion of a respective light scattering block with respect to a surface of the support layer SL is substantially the same as a maximum height of the second portion of the respective light scattering block with respect to a surface of a portion of the second inorganic encapsulating sub-layer CVD2 at the center of the area of the respective third aperture.

In some embodiments, a maximum height of the second portion of the respective light scattering block with respect to the surface of the support layer SL is less than the maximum height of the second portion of the respective light scattering block with respect to the surface of the portion of the second inorganic encapsulating sub-layer CVD2 at the center of the area of a respective third aperture of a plurality of third apertures AP3.

In another aspect, the present disclosure provides a display apparatus, including the display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display panel. In some embodiments, the method includes forming a pixel definition layer on a base substrate; forming a plurality of first apertures extending through the pixel definition layer; forming a light emitting layer at least partially in the plurality of first apertures; forming an encapsulating layer on a side of the pixel definition layer and the light emitting layer away from the base substrate; forming a bank layer on a side of the encapsulating layer away from the base substrate; forming a plurality of second apertures extending through the bank layer; and forming a color conversion layer at least partially in the plurality of second apertures. Optionally, forming the color conversion layer includes forming a plurality of color conversion blocks. Optionally, a minimum height of a bottom of the bank layer with respect to a surface of the base substrate is greater than a minimum height of a bottom of a respective color conversion block of the plurality of color conversion blocks with respect to the surface of the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:

a base substrate;

a pixel definition layer on the base substrate, having a plurality of first apertures extending through the pixel definition layer;

a light emitting layer at least partially in the plurality of first apertures;

an encapsulating layer on a side of the pixel definition layer and the light emitting layer away from the base substrate;

a bank layer on a side of the encapsulating layer away from the base substrate, having a plurality of second apertures extending through the bank layer; and a color conversion layer at least partially in the plurality of second apertures;

wherein the color conversion layer comprises a plurality of color conversion blocks; and a minimum height of a bottom of the bank layer with respect to a surface of the base substrate is greater than a minimum height of a bottom of a respective color conversion block of the plurality of color conversion blocks with respect to the surface of the base substrate;

wherein the encapsulating layer comprises a first inorganic encapsulating sub-layer, an organic encapsulating sub-layer on a side of the first inorganic encapsulating sub-layer away from the base substrate, and a second inorganic encapsulating sub-layer on a side of the organic encapsulating sub-layer away from the base substrate;

the color conversion layer is on a side of the second inorganic encapsulating sub-layer away from the organic encapsulating sub-layer; and a maximum height of the pixel definition layer with respect to the surface of the base substrate is greater than a height of a first portion of the second inorganic encapsulating sub-layer at a center of an area of a respective first aperture of the plurality of first apertures with respect to the surface of the base substrate;

wherein the color conversion layer comprises a plurality of color conversion blocks;

a first portion of a respective color conversion block of the plurality of color conversion blocks is in direct contact with the bank layer;

a second portion of the respective color conversion block is at the center of the area of the respective first aperture;

a maximum height of the first portion of a respective color conversion block with respect to a surface of a second portion of the second inorganic encapsulating sub-layer is substantially the same as a maximum height of the second portion of the respective color conversion block with respect to a surface of the first portion of the second inorganic encapsulating sub-layer; and an orthographic projection of the second portion of the second inorganic encapsulating sub-layer on the base substrate overlaps with an orthographic projection of the pixel definition layer on the base substrate.

2. The display panel of claim 1, wherein the color conversion layer comprises a plurality of color conversion blocks; and the respective color conversion block is partially in a respective second aperture of the plurality of second apertures and partially in the respective first aperture.

3. The display panel of claim 2, wherein the maximum height of the pixel definition layer with respect to the surface of the base substrate is greater than a minimum height of a bottom of the respective color conversion block with respect to the surface of the base substrate.

4. The display panel of claim 1, wherein a ratio of a maximum thickness of the pixel definition layer to a maximum thickness of the bank layer is greater than 0.2.

5. The display panel of claim 1, wherein a maximum height of a second portion of the second inorganic encapsulating sub-layer with respect to the surface of the base substrate is greater than the height of the first portion of the second inorganic encapsulating sub-layer at the center of the area of the respective first aperture with respect to the surface of the base substrate by at least 1 μm; and an orthographic projection of the second portion of the second inorganic encapsulating sub-layer on the base substrate overlaps with an orthographic projection of the pixel definition layer on the base substrate.

6. The display panel of claim 1, wherein a thickness of a first portion of the organic encapsulating sub-layer at the center of the area of the respective first aperture is greater than a thickness of a second portion of the organic encapsulating sub-layer; and an orthographic projection of the second portion of the organic encapsulating sub-layer on the base substrate overlaps with an orthographic projection of the pixel definition layer on the base substrate.

7. The display panel of claim 1, wherein, in a cross-section plane perpendicular to the surface of the base substrate and intersecting the bank layer, the pixel definition layer, and multiple adjacent color conversion blocks of the color conversion layer, a maximum width of the pixel definition layer is greater than a maximum width of the bank layer; and an orthographic projection of the pixel definition layer on the base substrate covers an orthographic projection of the bank layer on the base substrate.

8. The display panel of claim 1, wherein a maximum height of the second portion of the respective color conversion block with respect to the surface of the second portion of the second inorganic encapsulating sub-layer is less than the maximum height of the second portion of the respective color conversion block with respect to the surface of the first portion of the second inorganic encapsulating sub-layer.

9. The display panel of claim 1, further comprising:

a light scattering layer on a side of the second inorganic encapsulating sub-layer away from the organic encapsulating sub-layer;

wherein the bank layer has a plurality of third apertures extending through the bank layer;

the light scattering layer is at least partially in the plurality of third apertures;

the light scattering layer comprises a plurality of light scattering blocks; and a respective light scattering block of the plurality of light scattering blocks is partially in a respective third aperture of the plurality of third apertures and partially in an individual first aperture of the plurality of first apertures.

10. The display panel of claim 9, wherein the maximum height of the pixel definition layer with respect to the surface of the base substrate is greater than a minimum height of a bottom of the respective light scattering block with respect to the surface of the base substrate; and a maximum height of a top of the respective light scattering block with respect to the surface of the base substrate is greater than the maximum height of the pixel definition layer with respect to the surface of the base substrate.

11. The display panel of claim 1, further comprising a color filter on a side of the color conversion layer away from the base substrate;

wherein the color filter comprises a plurality of color filter blocks;

a first color filter block of the plurality of color filter blocks is at least partially in a respective second aperture of the plurality of second apertures, and in direct contact with a color conversion block; and a second color filter block of the plurality of color filter blocks is at least partially in a respective third aperture of a plurality of third apertures, and in direct contact with a light scattering block.

12. The display panel of claim 1, further comprising a support layer on a side of the encapsulating layer away from the base substrate;

wherein the bank layer is on a side of the support layer away from the encapsulating layer; and the support layer comprises a light absorbing material or a light reflecting material.

13. The display panel of claim 12, wherein, in a cross-section plane perpendicular to a surface of the base substrate and intersecting the bank layer, the support layer, the pixel definition layer, and multiple adjacent color conversion blocks of the color conversion layer, a maximum width of the support layer is greater than a maximum width of the bank layer; and an orthographic projection of the support layer on the base substrate covers an orthographic projection of the bank layer on the base substrate.

14. The display panel of claim 12, wherein a thickness of the support layer is greater than 1 μm.

15. A display apparatus, comprising the display panel of claim 1; and one or more integrated circuit connected to the display panel.

16. A display panel, comprising:

a base substrate;

a pixel definition layer on the base substrate, having a plurality of first apertures extending through the pixel definition layer;

a light emitting layer at least partially in the plurality of first apertures;

an encapsulating layer on a side of the pixel definition layer and the light emitting layer away from the base substrate;

a bank layer on a side of the encapsulating layer away from the base substrate, having a plurality of second apertures extending through the bank layer; and a color conversion layer at least partially in the plurality of second apertures;

wherein the color conversion layer comprises a plurality of color conversion blocks; and a minimum height of a bottom of the bank layer with respect to a surface of the base substrate is greater than a minimum height of a bottom of a respective color conversion block of the plurality of color conversion blocks with respect to the surface of the base substrate;

wherein the encapsulating layer comprises a first inorganic encapsulating sub-layer, an organic encapsulating sub-layer on a side of the first inorganic encapsulating sub-layer away from the base substrate, and a second inorganic encapsulating sub-layer on a side of the organic encapsulating sub-layer away from the base substrate;

the color conversion layer is on a side of the second inorganic encapsulating sub-layer away from the organic encapsulating sub-layer; and a maximum height of the pixel definition layer with respect to the surface of the base substrate is greater than a height of a first portion of the second inorganic encapsulating sub-layer at a center of an area of a respective first aperture of the plurality of first apertures with respect to the surface of the base substrate;

wherein the display panel further comprises a light scattering layer on a side of the second inorganic encapsulating sub-layer away from the organic encapsulating sub-layer;

wherein the bank layer has a plurality of third apertures extending through the bank layer;

the light scattering layer is at least partially in the plurality of third apertures;

the light scattering layer comprises a plurality of light scattering blocks; and a respective light scattering block of the plurality of light scattering blocks is partially in a respective third aperture of the plurality of third apertures and partially in an individual first aperture of the plurality of first apertures;

wherein a first portion of the respective light scattering block is in direct contact with the bank layer;

a second portion of the respective light scattering block is at the center of the area of the individual first aperture;

a maximum height of the first portion of a respective light scattering block with respect to a surface of a second portion of the second inorganic encapsulating sub-layer is substantially the same as a maximum height of the second portion of the respective light scattering block with respect to a surface of the first portion of the second inorganic encapsulating sub-layer; and an orthographic projection of the second portion of the second inorganic encapsulating sub-layer on the base substrate overlaps with an orthographic projection of the pixel definition layer on the base substrate.

17. The display panel of claim 16, wherein a maximum height of the second portion of the respective light scattering block with respect to the surface of the second portion of the second inorganic encapsulating sub-layer is less than the maximum height of the second portion of the respective light scattering block with respect to the surface of the first portion of the second inorganic encapsulating sub-layer.

18. A display panel, comprising:

a base substrate;

a pixel definition layer on the base substrate, having a plurality of first apertures extending through the pixel definition layer;

a light emitting layer at least partially in the plurality of first apertures;

an encapsulating layer on a side of the pixel definition layer and the light emitting layer away from the base substrate;

a bank layer on a side of the encapsulating layer away from the base substrate, having a plurality of second apertures extending through the bank layer; and a color conversion layer at least partially in the plurality of second apertures;

wherein the color conversion layer comprises a plurality of color conversion blocks; and a minimum height of a bottom of the bank layer with respect to a surface of the base substrate is greater than a minimum height of a bottom of a respective color conversion block of the plurality of color conversion blocks with respect to the surface of the base substrate;

wherein the display panel further comprises a support layer on a side of the encapsulating layer away from the base substrate;

wherein the bank layer is on a side of the support layer away from the encapsulating layer; and the support layer comprises a light absorbing material or a light reflecting material;

wherein the color conversion layer comprises a plurality of color conversion blocks;

a first portion of a respective color conversion block of the plurality of color conversion blocks is in direct contact with the support layer;

a second portion of the respective color conversion block is at a center of the area of a respective second aperture of the plurality of second apertures;

the encapsulating layer comprises a first inorganic encapsulating sub-layer, an organic encapsulating sub-layer on a side of the first inorganic encapsulating sub-layer away from the base substrate, and a second inorganic encapsulating sub-layer on a side of the organic encapsulating sub-layer away from the base substrate; and a maximum height of the first portion of a respective color conversion block with respect to a surface of the support layer is substantially the same as a maximum height of the second portion of the respective color conversion block with respect to a surface of a portion of the second inorganic encapsulating sub-layer at the center of the area of the respective second aperture.

* * * * *